(12) United States Patent
Hoe et al.

(10) Patent No.: US 8,108,810 B2
(45) Date of Patent: Jan. 31, 2012

(54) SYNCHRONOUS CIRCUIT SYNTHESIS USING AN ASYNCHRONOUS SPECIFICATION

(75) Inventors: James C Hoe, Pittsburg, PA (US);
Arvind Mithal, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 303 days.

(21) Appl. No.: 12/390,853

(22) Filed: Feb. 23, 2009
(Under 37 CFR 1.47)

(65) Prior Publication Data

US 2009/0268628 A1 Oct. 29, 2009

Related U.S. Application Data

(63) Continuation of application No. 11/142,003, filed on May 31, 2005, now abandoned, which is a continuation of application No. 09/641,997, filed on Aug. 18, 2000, now Pat. No. 6,901,055, which is a continuation-in-part of application No. 09/377,372, filed on Aug. 19, 1999, now Pat. No. 6,597,664.

(60) Provisional application No. 60/164,201, filed on Nov. 9, 1999.

(51) Int. Cl.
*G06F 17/50* (2006.01)
(52) U.S. Cl. ............................ 716/103; 716/104; 703/15
(58) Field of Classification Search ............... 716/103, 716/104; 703/15
See application file for complete search history.

(56) References Cited

U.S. PATENT DOCUMENTS

| 5,541,850 | A | 7/1996 | Vander Zanden et al. |
| 5,905,664 | A | 5/1999 | Ko et al. |
| 6,099,577 | A | 8/2000 | Isobe |
| 6,275,973 | B1 | 8/2001 | Wein |
| 6,597,664 | B1 | 7/2003 | Mithal et al. |
| 6,789,054 | B1 * | 9/2004 | Makhlouf ................... 703/6 |

(Continued)

FOREIGN PATENT DOCUMENTS

EP 0329233 8/1989
(Continued)

OTHER PUBLICATIONS

Wu et al., "A Synthesis Method for Mixed Synchronous/Asynchronous Behavior," Proceedings of European Design and Test Conference, Feb. 28-Mar. 3, 1994, pp. 227-287.
(Continued)

*Primary Examiner* — Phallaka Kik
(74) *Attorney, Agent, or Firm* — Occhiuti Rohlicek & Tsao LLP

(57) ABSTRACT

A method for specifying and synthesizing a synchronous digital circuit by first accepting a specification of an asynchronous system in which stored values are updated according to a set of state transition rules. For instance, the state transition rules are specified as a Term Rewriting System (TRS) in which each rule specifies a number of allowable state transitions, and includes a logical precondition on the stored values and a functional specification of the stored values after a state transition in terms of the stored values prior to the state transition. The specification of the asynchronous circuit is converted into a specification of a synchronous circuit in which a number of state transitions can occur during each clock period. The method includes identifying sets of state transitions, for example by identifying sets of TRS rules, that can occur during a single clocking period and forming the specification of the synchronous circuit to allow any of the state transitions in a single set to occur during any particular clocking period.

18 Claims, 22 Drawing Sheets

U.S. PATENT DOCUMENTS 6,977,907 B2    12/2005    Mithal et al.

FOREIGN PATENT DOCUMENTS

| EP | 0329233 | 10/1989 |
|---|---|---|
| EP | 08902120 | 9/1997 |
| EP | 0829812 | 3/1998 |

OTHER PUBLICATIONS

Dutt et al., "An Intermediate Representation for Behavior Synthesis," Proceedings of $27^{th}$ ACM/IEEE Design Automation Conference, Jun. 24-28, 1990, pp. 14-19.
Arvind et al., "Using Term Rewriting Systems to Design and Verify Processors," IEEE Micro Special Issue, May/Jun. 1999.
Babb et al., "Parallelizing Applications into Silicon," MIT Laboratory of Computer Science, Apr. 1999.
Cook et al., "Formal Verification of Explicitly Parallel Microprocessors," Mar. 5, 1999.
Examination Report from Corresponding EP Application 00955774.5-2201, Dec. 16, 2003.
International Preliminary Examination Report from corresponding PCT application PCT/US00/22888, Feb. 1, 2002.
International Search Report from Corresponding PCT Application PCT/US00/22888, Oct. 19, 2001.
Gupta et al., "Hardware-software Co-Synthesis for Digital Systems," Computer Science Laboratory, Stanford University, 1993.
Hoe et al., "Hardware synthesis from term rewriting systems," XP-001030153 (Dec. 1999).
Liao et al., "An Efficient Implementation of Reactivity for Modeling Hardware in the Scenic Design Environment," University of California at Irvine, 1997.
Matthews et al., "Microprocessor Specification in Hawk," 1998.
Poyneer et al., "A TRS Model for a Modern Microprocessor," MIT Computation Structures Group, Memo 408, Jun. 25, 1998.
Shen et al., "Design and Verification of Speculative Processors," MIT Computations Structures Group Memo 400(B), 1998.
Shen et al., "Modeling and Verification of ISA Implementations," MIT Computations Structures Group Memo 400(A), 1998.
Shen et al., "Using Term Rewriting Systems to Design and Verify Processors," Massachusetts Institute of Technology (Jun. 1999).
Shen et al., "Using Term Rewriting Systems to Design and Verify Processors," IEEE MICRO, vo. 19, No. 3, pp. 36-46, XP002179293 (May 6, 1999).
Subrahmanyam et al., "Automated Synthesis of Mixed-Mode (Asynchronous and Synchronous) Systems," AT&T Technical Journal (Jan. 1991).
Subrahmanyam et al., "Automated Synthesis of Mixed-Mode (Asynchronous and Synchronous) Systems," AT&T Technical Journal, vol. 70, No. 1, pp. 111-124 (XP000234136) (Jan. 1991).
Windley, P., "Specifying Instruction-Set Architectures in HOL: A Primer," Brigham Young University 1994.
Windley, P, "Verifying Pipelines Microprocessors," Brigham Young University 1995.

\* cited by examiner

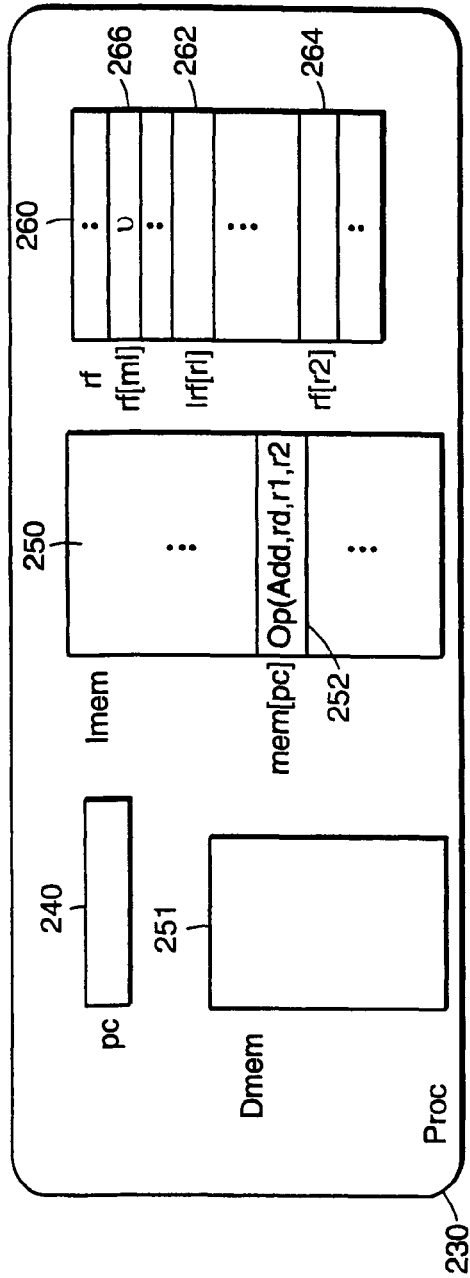

| 701 | *Type* | PROC = Proc(PC,RF,IMEM,DMEM) |
|---|---|---|
| 702 | *Type* | PC = Bit[$n$] |
| 703 | *Type* | ADDR = Bit[$n$] |
| 704 | *Type* | VALUE = Bit[$n$] |
| 705 | *Type* | RF = *Array* VALUE[RNAME] |
| 706 | *Type* | RNAME = Reg0 ‖ Reg1 ‖ Reg2 ‖ Reg3 ‖ .... Reg$m$ |
| 707 | *Type* | IMEM = *Array* INST[PC] |
| 708 | *Type* | DMEM = *Array* VALUE[ADDR] |
| 709 | *Type* | INST = Loadc(RNAME,VALUE) |
| 710 | | ‖ Loadpc(RNAME) |
| 711 | | ‖ Op(MINOR,RNAME,RNAME,RNAME) |
| 712 | | ‖ Bz(RNAME,RNAME) |
| 713 | | ‖ Load(RNAME,RNAME) |
| 714 | | ‖ Store(RNAME,RNAME) |
| 715 | *Type* | MINOR = Add ‖ Sub ‖ .... |

FIG. 7

801 Proc(*pc,rf,im,dm*)
802 *if im*[*pc*]≡Loadc(*rd,const*) → Proc(*pc*+1,*rf*[*rd*:=*const*],*im,dm*)
803 *if im*[*pc*]≡Loadpc(*rd*) → Proc(*pc*+1,*rf*[*rd*:=*pc*],*im,dm*)
804 *if im*[*pc*]≡Op(*op,rd,r1,r2*) → Proc(*pc*+1,*rf*[*rd*:=*op*(*rf*[*r1*],*rf*[*r2*])],*im,dm*)
805 *if im*[*pc*]≡Bz(*rc,rt*) & *rf*[*rt*]≡0 → Proc(*rf*[*rt*],*rf,im,dm*)
806 *if im*[*pc*]≡Bz(*rc,rt*) & *rf*[*rt*]≠0 → Proc(*pc*+1,*rf,im,dm*)
807 *if im*[*pc*]≡Load(*rd,ra*) → Proc(*pc*+1,*rf*[*rd*:=*dm*[*rf*[*ra*]]],*im,dm*)
808 *if im*[*pc*]≡Store(*ra,r*) → Proc(*pc*+1,*rf,im,dm*[*rf*[*ra*]:=*rf*[*r*]])

FIG. 8

| | | |
|---|---|---|
| 1101 | *Type* | PROC$_p$ = Proc$_p$(PC,RF,BS,IMEM,DMEM) |
| 1102 | *Type* | BS = *FIFO* ITEMP |
| 1103 | *Type* | ITMEP = Op(MINOR,RNAME,VALUE,VALUE) |
| 1104 | | ‖ Bz(VALUE,VALUE) |
| 1105 | | ‖ Load(RNAME,ADDR) |
| 1106 | | ‖ Store(ADDR,VALUE) |

FIG. 11

1201   $\text{Proc}_p(pc, rf, bs, im, dm)$
1202       $if\ im[pc] \equiv inst\ and\ (Source(inst) \cap Target(bs)) \equiv 0$
1203   → $\text{Proc}_p(pc+1, rf, eng(bs, Decode(inst)), im, dm)$

FIG. 12A

1211   $\text{Proc}_p(pc, rf, bs, im, dm)$ where $itemp := first(bs)$
1212   $if\ itemp \equiv Op(op, rd, v1, v2)$ → $\text{Proc}_p(pc, rf[rd := \underline{op}(v1, v2)], deg(bs), im, dm)$
1213   $if\ itemp \equiv Bz(vc, vt)\ \&\ vc \equiv 0$ → $\text{Proc}_p(vt, rf, clear(bs), im, dm)$
1214   $if\ itemp \equiv Bz(vc, vt)\ \&\ vc \neq 0$ → $\text{Proc}_p(pc, rf, deq(bs), im, dm)$
1215   $if\ itemp \equiv Load(rd, va)$ → $\text{Proc}_p(pc, rf[rd := dm(va)], deg(bs), im, dm)$
1216   $if\ itemp \equiv Store(va, v)$ → $\text{Proc}_p(pc, rf, deq(bs), im, dm[va := v])$

FIG. 12B

1301     $Proc_p(pc, rf, bs, im, dm)$
1302         if $im[pc] \equiv inst$ and $im[pc+1] \equiv inst'$
1303         and $Source(inst) \cap Target(bs) \equiv 0$
1304         and $Source(inst') \cap Target(bs) \cup Target(inst)) \equiv 0$
1305 → $Proc_n((pc+1)+1, rf, eng(eng(bs, Decode(inst)), Decode(inst'))im, dm)$

FIG. 13A $Proc_p(pc, rf, bs, im, dm)$ where $Op(op, rd, v1, v2) := first(bs), itemp := first(deq(bs))$ if $itemp \equiv Op(op', rd', v1', v2')$ → $Proc_p(pc, (rf[rd:=\underline{op}(v1, v2)])[rd':=\underline{op'}(v1', v2')], deq(deg(bs)), im, dm)$ if $itemp \equiv Bz(vc, vt)$ & $vc \equiv 0$ → $Proc_p(vt, rf[rd:=\underline{op}(v1, v2)], clear(bs)), im, dm)$ if $itemp \equiv Bz(vc, vt)$ & $vc \neq 0$ → $Proc_p(pc, rf[rd:=\underline{op}(v1, v2)], deq(deq(bs)), im, dm)$ if $itemp \equiv Load(rd', va)$ → $Proc_p(pc, (rf[rd:=\underline{op}(v1, v2)])[rd':=dm[va]], deq(deq(bs)), im, dm)$ if $itemp \equiv Store(va, v)$ → $Proc_p(pc, rf[rd:=\underline{op}(v1, v2)], deq(deq(bs)), im, dm[va:=v])$

FIG. 13B

1321　$\text{Proc}_p(pc,rf,bs,im,dm)\text{ where }\text{Bz}(vc,vt):=\text{first}(bs),itemp:=\text{first}(\text{deq}(bs))$ 1322　*if itemp* ≡ Op(*op,rd,v1,v2*)&*vc*≠ 0　→　$\text{Proc}_p(pc,rf[rd:=\underline{op}(v1,v2)],\text{deq}(\text{deq}(bs)),im,dm)$ 1323　*if itemp* ≡ Bz(*vc',vt'*) & *vc*≠ 0 & *vc'* ≡ 0　→　$\text{Proc}_p(vt,rf,\text{clear}(bs),im,dm)$ 1324　*if itemp* ≡ Bz(*vc',vt'*) & *vc*≠ 0 & *vc'* ≠ 0　→　$\text{Proc}_p(pc,rf,\text{deq}(\text{deq}(bs)),im,dm)$ 1325　*if itemp* ≡ Load(*rd,va*) & *vc*≠ 0　→　$\text{Proc}_p(pc,rf[rd:=dm[va]],\text{deq}(\text{deq}(bs)),im,dm)$ 1326　*if itemp* ≡ Store(*va,v*) & *vc*≠ 0　→　$\text{Proc}_p(pc,rf,\text{deq}(\text{deq}(bs)),im,dm[va:=v])$

FIG. 13C

1331　$\text{Proc}_p(pc,rf,bs,im,dm)\text{ where }\text{Load}(rd,va):=\text{first}(bs),itemp:=\text{first}(\text{deq}(bs))$ 1332　*if itemp*≡Op(*op,rd',v1,v2*)　→　$\text{Proc}_p(pc,(rf[rd:=dm[va]])[rd':=\underline{op}(v1,v2)],\text{deq}(\text{deq}(bs)),im,dm)$ 1333　*if itemp* ≡ Bz(*vc,vt*)& *vc*≡0　→　$\text{Proc}_p(pc,(f[rd:=dm[va]]),\text{clear}(bs),im,dm)$ 1334　*if itemp* ≡ Bz(*vc,vt*)& *vc*≠0　→　$\text{Proc}_p(pc,(rf[rd:=dm[va]]),\text{deq}(\text{deq}(bs)),im,dm)$

FIG. 13D

1341　$\text{Proc}_p(pc,rf,bs,im,dm)\text{ where }\text{Store}(va,v):=\text{first}(bs),itemp:=\text{first}(\text{deq}(bs))$ 1342　*if itemp* ≡Op(*op,rd,v1,v2*))　→　$\text{Proc}_p(pc,rf[rd:=\underline{op}(v1,v2)],\text{deq}(\text{deq}(bs)),im,dm[va:=v]$ 1343　*if itemp* ≡ Bz(*vc,vt*)& *vc*≡0　→　$\text{Proc}_p(vt,rf,\text{clear}(bs),im,dm[va:=v])$ 1344　*if itemp* ≡ Bz(*vc,vt*)& *vc*≠0　→　$\text{Proc}_p(pc,rf,\text{deq}(\text{deq}(bs)),im,dm[va:=v])$

| $\pi_A$ | $\pi_B$ | $\pi_D$ | $\pi_E$ | $\varphi_A$ | $\varphi_B$ | $\varphi_D$ | $\varphi_E$ | |
|---|---|---|---|---|---|---|---|---|
| 0 | 0 | 0 | 0 | 0 | 0 | 0 | 0 | |
| 0 | 0 | 0 | 1 | 0 | 0 | 0 | 1 | |
| 0 | 0 | 1 | 0 | 0 | 0 | 1 | 0 | 2204 |
| 0 | 0 | 1 | 1 | 0 | 0 | 1 | 0 | |
| 0 | 1 | 0 | 0 | 0 | 1 | 0 | 0 | 2206 |
| 0 | 1 | 0 | 1 | 0 | 1 | 0 | 1 | |
| 0 | 1 | 1 | 0 | 0 | 1 | 0 | 0 | |
| 0 | 1 | 1 | 1 | 0 | 1 | 0 | 1 | |
| 1 | 0 | 0 | 0 | 1 | 0 | 0 | 0 | |
| 1 | 0 | 0 | 1 | 1 | 0 | 0 | 1 | |
| 1 | 0 | 1 | 0 | 1 | 0 | 0 | 0 | |
| 1 | 0 | 1 | 1 | 1 | 0 | 0 | 1 | |
| 1 | 1 | 0 | 0 | 1 | 1 | 0 | 0 | 2213 |
| 1 | 1 | 0 | 1 | 1 | 1 | 0 | 1 | |
| 1 | 1 | 1 | 0 | 1 | 1 | 0 | 0 | |
| 1 | 1 | 1 | 1 | 1 | 1 | 0 | 1 | |

FIG. 22

SYNCHRONOUS CIRCUIT SYNTHESIS USING AN ASYNCHRONOUS SPECIFICATION

CROSS-REFERENCE TO RELATED APPLICATIONS

This application is a continuation of U.S. patent application Ser. No. 11/142,003, filed on May 31, 2005 now abandoned, which is a continuation of Ser. No. 09/641,997, filed Aug. 18, 2000, now U.S. Pat. No. 6,901,055, issued on May 31, 2005 which is a continuation-in-part of Ser. No. 09/377,372, filed Aug. 19, 1999, now U.S. Pat. No. 6,597,664, issued on Jul. 22, 2003 and which also claims the benefit of U.S. Provisional Application No. 60/164,201 filed Nov. 9, 1999. The prior applications are incorporated herein by reference.

BACKGROUND

This invention relates to design and synthesis of synchronous digital circuits.

Hardware description languages (HDLs) have been used for some time to design electronic circuits, and in particular to design synchronous (clocked) digital circuits. One class of hardware description languages are "register-transfer languages" (RTLs) in which the circuit has, or is abstracted to have, a set of registers, and the language specifies the values of the registers in each clock period in terms of the values in the previous clock period. A widely used HDL is Verilog, which has been standardized as IEEE standard 1364-1995, and for which numerous software tools are available. Verilog supports a variety of specification approaches, including a RTL approach.

Design of complex digital circuits, such as pipelined and superscalar processors, using an RTL approach typically requires a hardware architect to specify the overall functionality of the system which can be defined in terms of modular components that are defined separately, as well as specify the correct coordination of concurrent processing modules in the circuit. As hardware systems become more complex, for example pipelined processors which allow out-of-order and speculative instruction execution, this task is increasingly time consuming and is subject to human error.

Other HDL approaches attempt to specify a digital circuit in "behavioral" terms, without necessarily identifying the structure of the underlying circuit. For instance, Verilog supports such a behavioral specification approach. However, it is not always possible or feasible to synthesize an equivalent digital circuit from such a behavioral specification.

A variety of software tools are available for processing HDL specifications, including tools for simulating the specified circuits. Formal verification of the correctness of an HDL specification is often difficult, or even impossible, due in part to the nature and complexity of the specification.

SUMMARY

In one aspect, in general, the invention is a method for making a synchronous digital integrated circuit according to a specification of an asynchronous digital system. The specification of the asynchronous digital system is first accepted, for instance, from an architect or hardware designer who has composed the specification. This specification includes specifications of a number of data elements whose values define a state of the system, and specifications of a number of state transition rules that characterize non-deterministic operation of the system. Application of each of the state transition rules in the asynchronous system atomically updates values of the data elements according to the specification of the state transition rule. According to the method, the specification of the asynchronous system is processed to form a specification of a synchronous digital system such that state transitions of the synchronous system each correspond to application of one or more state transition rules of the asynchronous system. The specification of the synchronous digital system is then processed to form a specification of the synchronous digital integrated circuit, and the digital integrated circuit is fabricated according to the specification for the synchronous digital integrated circuit. In the way, the integrated circuit operates according to the specification of the asynchronous digital system.

The method can include one or more of the following features:

Processing the specification of the synchronous digital system to form a specification of the synchronous digital integrated circuit can include forming a specification of the integrated circuit using a register-transfer language (RTL).

Forming a specification of the integrated circuit using a register-transfer language includes optimizing the specification of the integrated circuit.

The specification using the register-transfer language includes a Verilog specification.

The specification of each of the state transition rules includes a specification of a logical precondition for enabling the rule and a specification of a resulting state that is reached as a result of applying the rule.

The specification of the asynchronous digital system includes a term rewriting system (TRS) specification of the system that includes the specifications of the state transition rules.

In another aspect, in general, the invention is a method for designing a synchronous digital system according to a specification of an asynchronous digital system. The method includes accepting the specification of the asynchronous digital system, including accepting specifications of a number of data elements whose values define a state of the system and accepting specifications of a number of state transition rules that characterize non-deterministic operation of the system. Application of each of the state transition rules atomically updates values of the data elements according to the specification of that state transition rule. The method then includes processing the specification of the asynchronous system to form a specification of the synchronous digital system such that state transitions of the synchronous system each correspond to application of zero or more state transition rules of the asynchronous system.

The method can include one or more of the following features:

The synchronous digital system is such that any state transition of the synchronous system corresponds to application of at most one state transition rule of the asynchronous system.

The synchronous digital system is such that at least some state transitions of the synchronous system correspond to application of two or more state transition rules of the asynchronous system.

Processing the specification of the asynchronous system includes identifying a number of groups of multiple of the state transition rules such that a state transition of the synchronous system that corresponds to application of state transitions from a single of the groups is permissible.

Processing the specification of the asynchronous system includes determining a number of disjoint sets of potentially conflicting state transition rules such that concurrent application of any pair of rules taken from two different of the sets do not conflict in their access to the data elements and concurrent application any pair of rules taken from a single of the sets may conflict in their access to one or more of the data elements.

Processing the specification also includes identifying the groups of multiple of the state transition rules such that each group includes at most one rule from each of the sets of potentially conflicting state transition rules.

Processing the specification of the asynchronous system includes specifying a component of the digital system that implements a selection of at most one rule from each of the sets of potentially conflicting rules.

Processing the specification of the asynchronous system includes enumerating groups of the state transition rules such that concurrent application of multiple rules in any single of the groups does not conflict in their access to the data elements.

Processing the specification of the asynchronous system includes specifying a component of the digital system that encodes the enumeration of the number of groups.

Processing the specification of the asynchronous system includes enumerating groups of the state transition rules such that concurrent application of multiple rules in any single of the groups does not conflict in their access to the data elements includes enumerating one or more separate groups of state transition rules that do not conflict within different ones of the disjoint sets of potentially conflicting state transition rules.

Identifying the groups of multiple of the state transition rules is such that each of the groups includes at most one enumerated group from each of the sets of potentially conflicting state transition rules.

Processing the specification of the asynchronous system includes identifying sequences of two or more state transitions rules such that a state transition of the synchronous system that corresponds to applications of any of the sequences of two or more rules in sequence corresponds to application of the last of the sequence alone.

Processing the specification of the asynchronous system includes specifying a component of the digital system that implements a selection of the last of the sequence when each of the sequence of two or more rules are enabled.

Identifying the groups of multiple of the state transition rules is such that each of the groups includes at most one of the sequences of two or more state transitions from each of the sets of potentially conflicting state transition rules.

Processing the specification of the asynchronous system includes identifying a plurality of sequences of state transition rules such that for any particular of the sequences, a state transition of the synchronous system that corresponds to sequence application of any subset of that sequence is functionally equivalent to sequential application of that subset of rules in the order or the sequence in the asynchronous system.

Processing the specification of the asynchronous system includes specifying a component of the digital system that for at least some of the data elements implements a calculation of new values for those data elements for a state transition of the synchronous system corresponds to sequential application of state transition rules of the asynchronous system in a sequence according one of the plurality of sequences.

In another aspect, in general, the invention is software stored on a computer-readable medium for causing a computer system to perform a function of designing a synchronous digital system according to a specification of an asynchronous digital system In another aspect, in general, the invention is a computer-controlled system for designing a synchronous digital system according to a specification of an asynchronous digital system comprising means for accepting the specification of the asynchronous digital system, including accepting specifications of a plurality of data elements whose values define a state of the system and accepting specifications of a plurality of state transition rules that characterize non-deterministic operation of the system and wherein application of each of the state transition rules atomically updates values of the data elements according to the specification of the state transition rule; and means for processing the specification of the asynchronous system to form a specification of the synchronous digital system such that state transitions of the synchronous system each correspond to application of zero or more state transition rules of the asynchronous system.

The invention has one or more of the following advantages:

A system that is intended to be implemented as a synchronous digital system, such as a synchronous digital circuit implemented as an integrated circuit, can be initially designed using an asynchronous system specification. Such an asynchronous specification is often significantly less complex than a corresponding synchronous specification. For example, the asynchronous specification does not need to include features of concurrent pipelined or concurrent operation that are often part of a synchronous specification. Furthermore, the asynchronous specification may be more directly related to an external specification of the system, such as a specification of a computer bus or a specification of a communication protocol according to which the system is intended to function.

The asynchronous specification may also be more amenable to automated or semi-automated validation approaches. The synchronous specification is guaranteed to be a valid implementation of the asynchronous system, and therefore further validation of the synchronous system may be unnecessary. This reduces design errors that are introduce while optimizing a circuit design, for example, by introducing deep pipelined architectures or large-scale concurrency.

For a particular asynchronous specification, various alternative synchronous implementations can be synthesized. The alternative implementations can make different tradeoffs between concurrency and required circuit resources. That is, a relatively slower-operating implementation can be synthesized using fewer circuit elements than a relatively faster implementation.

A single asynchronous specification can be used to synthesize multiple circuit modules that are designed to communicate among one another. Also, one or more modules can be implemented in software according to the asynchronous specification and correctly interact with modules implemented as digital circuits.

As communication protocols or computer interfaces specification evolve, new circuitry that implements those protocols and interfaces can be rapidly designed using the automated approach without necessarily requiring large amounts of manual design effort to yield efficient implementations of those new protocols and interfaces.

Other features and advantages of the invention are apparent from the following description, and from the claims.

DESCRIPTION OF DRAWINGS

FIGS. 2A-B illustrate storage elements and TRS rules for a first exemplary asynchronous system specification;

FIG. 7 is a set of data type declarations of a system specification;

FIG. 8 is a set of rewrite rules of a system specification;

FIG. 11 is a set of data type declarations for a processor which includes a pipeline buffer;

FIGS. 12A-B are rewrite rules for a system which makes use of a pipeline buffer;

FIGS. 13A-E are composite rewrite rules for a superscalar implementation;

FIG. 18A is a graph with arcs that correspond to sequential composability between rules;

FIG. 18B is an acyclic graphs formed from arcs which correspond to sequential composability between rules;

FIG. 18C is an undirected conflict graph with arc corresponding to potential conflicts between rules;

FIG. 19A is an acyclic graph formed from arcs which correspond to sequential composability between rules;

FIG. 19B is an undirected conflict graph;

FIG. 22 is a table showing input-output characteristics for an enumerated encoder for triggering sequentially composable rules in a scheduling sub-group.

DESCRIPTION

1 Overview

Figure 1:
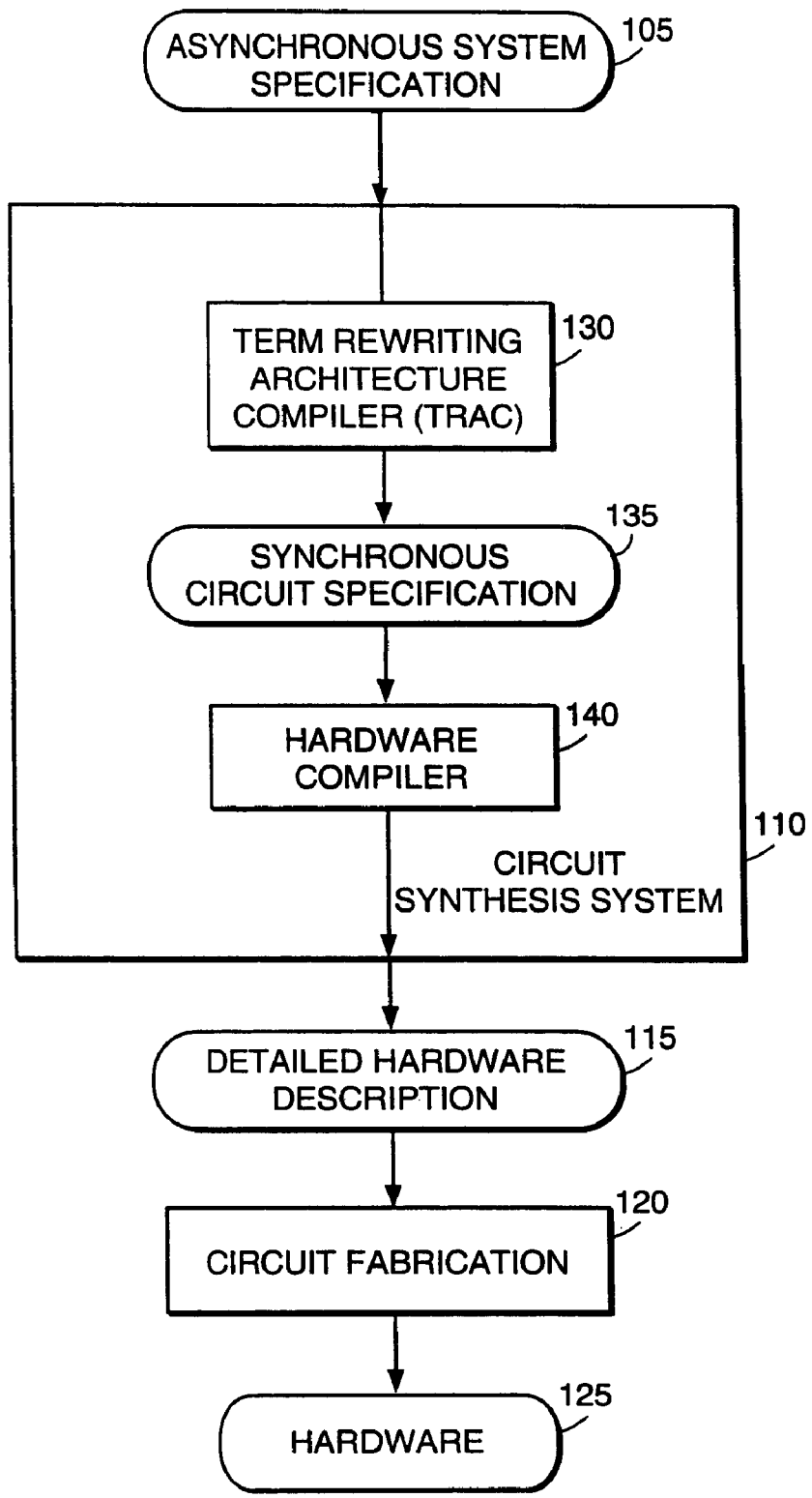
FIG. 1 illustrates processing of an asynchronous system specification to form a detailed hardware description.

Referring to FIG. 1, a circuit synthesis system 110 accepts an asynchronous system specification 105 and produces a detailed hardware description 115, which describes a synchronous (clocked) digital circuit that functions according to the asynchronous system specification. Circuit synthesis system 110 includes a term rewriting architecture compiler (TRAC) 130, which accepts asynchronous system specification 105 and produces a synchronous circuit specification 135. TRAC 130 is a software application which when executed on a general-purpose computer implements the circuit synthesis approach described below. In this version of circuit synthesis system 110, synchronous circuit specification 135 uses a subset of the Verilog hardware description language (HDL). In particular, synchronous circuit specification 135 uses a register transfer language (RTL) subset of Verilog. Synchronous circuit specification 135 passes to a hardware compiler 140, in this instance a Verilog compiler, which produces detailed hardware description 115 as output. Circuit fabrication 120 makes use of detailed hardware description 115 to fabricate hardware 125, for example a field programmable gate array. Hardware 125 is configured according to synchronous circuit specification 135 and thereby operates according to asynchronous system specification 105 in that when viewed once per clock period, the operation of hardware 125 is allowed by asynchronous system specification 105.

In the embodiments described below, asynchronous system specification 105 is specified in terms of a Term Rewriting System (TRS). Term Rewriting Systems (TRS) can be used for design and verification of complex digital systems, such as general-purpose computer processors. See, for example, Arvind and X. Shen, "Using Term Rewriting Systems to Design and Verify Processors," MIT LCS Memo CSG-419, *IEEE Micro*, May/June 1999, in which an example of a processor with speculative instruction execution is described. It should be understood that this approach to specifying systems using a TRS is not limited to processor design, but is equally suited to specification and design of other types of systems, including but not limited to memory controllers, distributed shared memory systems, and communication devices such as data routers.

In the context of asynchronous system specification 105, the content of number of named storage elements defines the state of the asynchronous system. These storage elements correspond to actual or abstract data types. An actual data type is one for which the storage structure and operation is completely known, whereas an abstract data type is defined only in terms of its interface which defines its externally visible behavior. Both actual and abstract data types have defined interfaces that include the possible actions that can be performed on storage elements of those data type and the arguments of those actions, as well as functions for accessing values in the storage elements. Examples of actual data types include a register that holds a single value. An action for a register would typically include set(val), and clear( ), while a function for access the value in a register is get( ). Examples of abstract data types include a array, FIFO queue, content-addressable FIFO, push-down stack, or other storage for multiple values that allows access to some but not necessarily all of the values, or other elements with well-defined interface semantics. Example of an actions on a FIFO include enqueue (val), dequeue( ), and clear, while functions for accessing values or state of the FIFO might include first( ), which returns the head of the FIFO, and Boolean functions full( ) and empty( ) that return a status of the FIFO.

Hardware 125 can be a single integrated circuit, in which some or all of the circuit is specified by detailed hardware description 115. As is discussed further below, hardware 125 can alternatively be made up of a number of interconnected integrated circuits, for example a separate memory controller and a processor that are meant to be interconnected by a communication bus, or separate communication devices, such as routers, that are intended to be connected by an extended communication channel. Also, in some embodiments, some or all of the synchronous system is implemented using software, for example using a micro-coded module within a circuit, or by making use of a programmable general purpose processor to implement some of the system.

TRAC 130 performs several steps in transforming asynchronous system specification 105 to form synchronous circuit specification 135. In many of the embodiments or approaches described below, TRAC 130 identifies sets of state transition rules of the asynchronous system specification that can be statically determined to be applicable within a single clocking cycle of the synchronous system without introducing conflicting access to storage elements that cannot be resolves statically at the time that the circuit is synthesized. TRAC 130 synthesizes enabling logic that generates signals indicating which rules are enabled given the state of the synchronous system, arbitration logic (also referred to as triggering logic) which selects a subset of the enabled rules to trigger for application in the same cycle of the synchronous circuit, update logic that generates updated values for the storage elements based on application of the rules, and update combination logic that selects from or otherwise combines updated values with which to update the storage elements in the situations that more than one rule that can update a particular storage element. The general approach taken by TRAC is to trigger a subset of enabled rules that were statically identified as being applicable in a single cycle, with many of the embodiments having a goal of triggering many rules in each cycle of the synchronous circuit in order to achieve fast operation of the synchronous circuit.

2 First Example

Referring to FIG. 2A, a first exemplary asynchronous system specification 105 characterizes a single-cycle (i.e., not pipelined) processor. Note that as discussed above, similar approaches to system specification are equally applicable to systems other than processors. The simplified processor used in this example is intended to illustrate the use of TRS. The processor has a number of storage elements, including a program counter register, PC 240, an addressable instruction memory, IMEM 250, which holds processor instructions, an addressable data memory, DMEM 251, and a register file, RF 260, which holds data values. These four storage elements are grouped to form PROC 230. Referring to FIG. 2B, asynchronous system specification 105 includes TRS rules 210, which includes a number of individual rules 220 that describe allowable transitions in the values in the storage elements. An exemplary rule 220, the "Add Rule," in TRS rules 210 governs addition of two values stored in register file RF 260. Each rule 220 in TRS rules 210 has a left-hand-side (LHS) term 222, a predicate 224, and a right-hand-side (RHS) term 226. Each rule is, in general, applicable in multiple different arrangements of values in the storage elements (states) of the system as defined by its LHS term 222 and predicate 224. A primitive, or "delta," rule is applicable in only one state. A general rule is a shorthand expressed in terms of variables that represents a number of delta rules. For any rule, its RHS term 226 uniquely specifies new values of the storage elements (the new state) in terms of the values in storage elements at the time the rule was applied. Operation of the specified asynchronous system is based on the assumption that any rule is applied atomically, that is, storage elements are updated according to one rule before a new rule is considered.

In this first example, rule 220 shown in FIG. 2B has the following elements:

```
Rule 220:
LHS term 222
if Predicate 224
→ RHS term 226
Add Rule:
Proc(pc,rf,im,dm)
   if im[pc] is Op(Add,rd,r1,r2)
→ Proc(pc+1,rf[rd:=v],im,dm)
      where v=rf[r1]+rf[r2]
```

The term Proc( ) has four positional arguments. Referring to FIG. 2A, the first argument, pc, matches PC 240, the second argument, rf, matches register file RF 260, and the third argument, im, matches instruction memory IMEM 250, and the fourth argument, dm, matches data memory DMEM 251. The exemplary rule shown above is read as "If the system has a term 'Proc(pc,rf im,dm)' and im at address pc holds an instruction with opcode Add and variable arguments rd, r1, and r2 then the term 'Proc(pc,rf im,dm)' is replaced (i.e., rewritten) such that pc is replaced with pc+1, and the rd entry of register file rf is replaced with the value v, which is the sum of the r1 entry and the r2 entry of register file rf."

Note that in the rules, arguments such as im and Proc match actual storage elements or defined groups of storage elements, in this case IMEM 250 and Proc 230. The LHS term of a rule can, in general, be matched in multiple ways to storage elements of the system. For example, in a system with multiple identical processors a single rule applicable to a processor could be matched to any of the processors. When a rule can be matched to different storage elements of the system, the rule is essentially treated as separate multiple rule instances of the same rule each with a defined mapping to storage elements.

Two additional rules in this first example are used to specify a branch-if-zero instructions as:

```
Bz-taken rule:
Proc(pc,rf,im,dm)
   if im[pc] is Bz(rc,ra) AND rf[rc] is 0
→ Proc(rf[ra],rf,im,dm)
Bz-not-taken rule:
Proc(pc,rf,im,dm)
   if im[pc] is Bz(rc,ra) AND rf[rc] is not 0
→ Proc(pc+1,rf,im,dm)
```

The first rule, the "Bz-taken" rule, updates pc with the content of rf[ra] if the content of rf[rc] is zero, while the second rule, the "Bz-not-taken" rule, increments pc if rf[rc] is not zero.

Additional instructions, including move pc to register, load immediate, register-to-register subtraction, and memory load and store, are specified using similarly structured TRS rules. An approach to compilation of these types rules into a synchronous circuit specification is described fully below.

For any state of the system, in general, multiple but not necessarily all rules can be applied based on their LHS terms and predicates. In this simple example, one way to specify a synchronous implementation of the rules is to "enable" all rules that are applicable to the state at the beginning of each clocking period and to essentially concurrently update the state according the RHS terms of all the rules that are enabled. By concurrently, we mean that the LHS term and the predicate for each rule is evaluated concurrently at the beginning of a clocking period, and the rewrite values in the RHS terms are computed using those initial values, and all updates to the values are performed at the end of a clocking period. Note that, in general, enabling all the applicable rules is not feasible due to possible conflicts, such as multiple rules updating the same location, or a rule updating a value used by another rule. For this simple example, at most one rule is applicable to any particular state of the system, and at most a single state transition therefore occurs in each clocking period.

3 Second Example

Figure 3A:
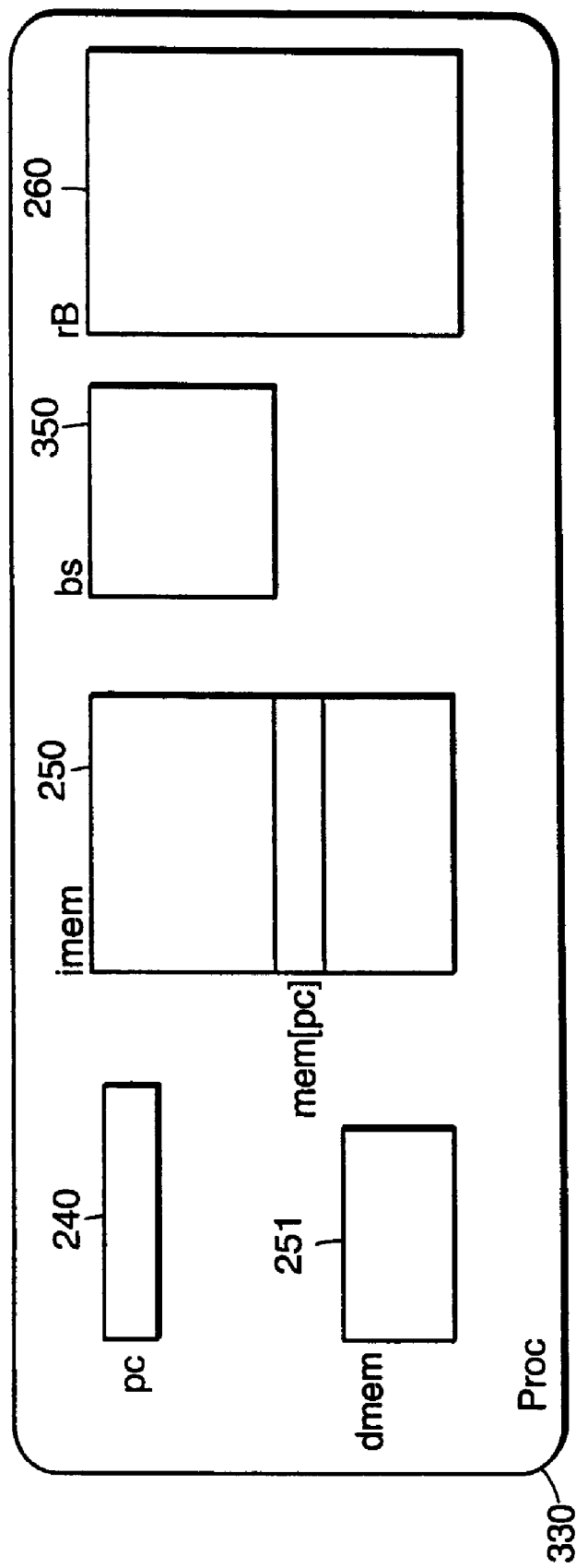
FIG. 3A illustrates storage elements for a second exemplary asynchronous system specification.
Figure 3B:
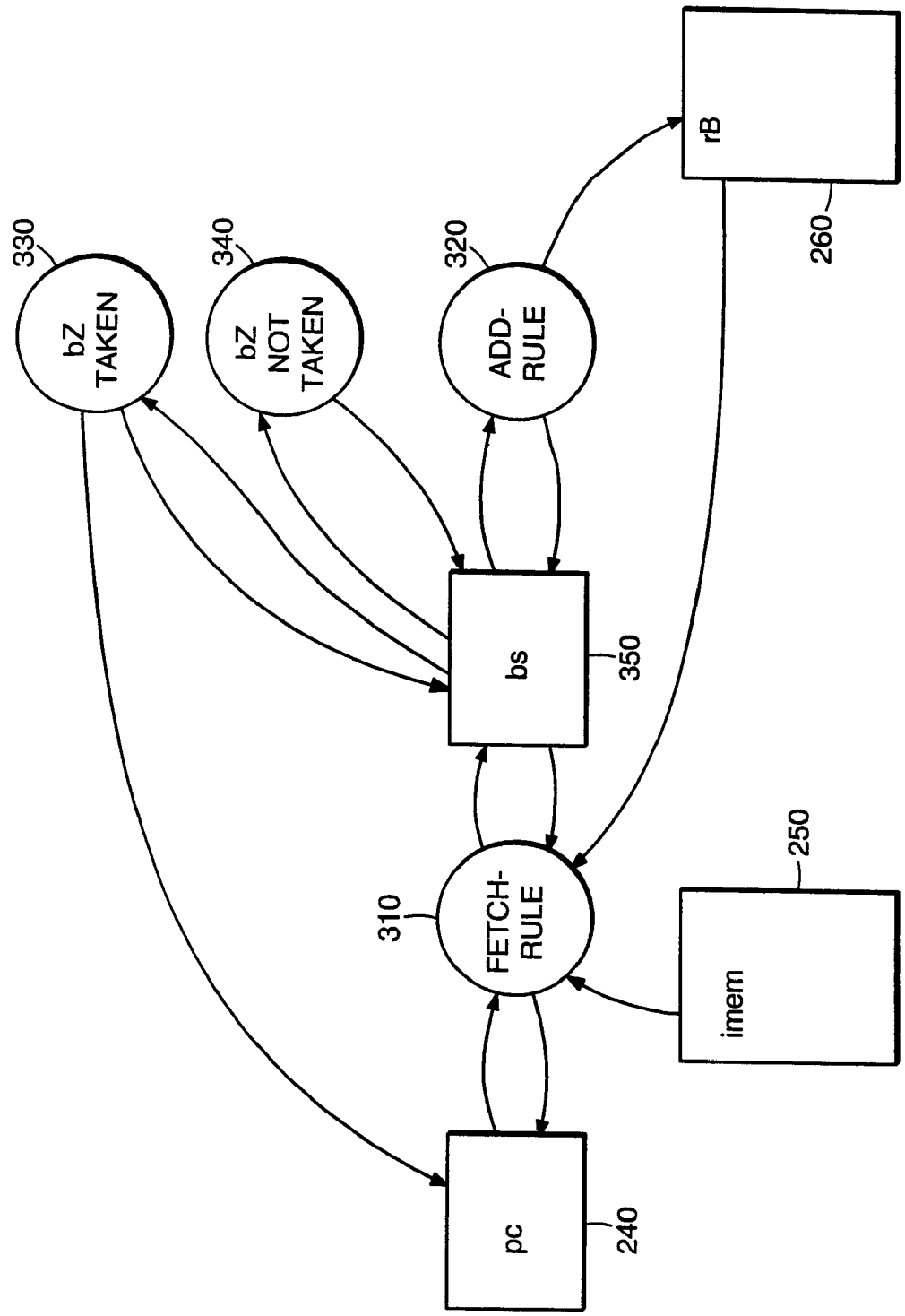
FIG. 3B illustrates dependencies of rules on storage elements.

Referring to FIGS. 3A-B, a second exemplary asynchronous system specification 105 specifies a processor that uses a pipeline buffer BS 350, which is a FIFO queue storage element, into which the processor can fetch an instruction in a clock cycle prior to executing it. The notation for the content of a FIFO is a series of subsequences or values. For example, enqueuing a value a into a FIFO with a prior value bs is denoted enq(bs,a). Similarly, nonempty(bs) is a Boolean function that returns true if the FIFO is not empty, that is, if bs has some elements in it. The first element of a nonempty FIFO is referenced as first(bs). The first (least recently enqueued) element of a nonempty FIFO is removed by deq(bs), which is a function whose value is the FIFO with the first element removed.

Referring to FIG. 3A, PROC 330 has five storage elements, in their order as positional arguments in a Proc term: PC 240, RF 260, BS 350, IMEM 250, and DMEM 251. A subset of TRS Rules 210 for this second example is as follows:

```
Fetch Rule 310:
Proc(pc,rf,bs,im,dm)
if im[pc]=inst and Source(inst) does not intersect Target(bs)
→ Proc(pc+1,rf,bs',im,dm)
where bs' is enq(bs,Decode(im[pc]))
Add Rule 320:
Proc(pc,rf,bs,im,dm)
if first(bs) is Op(Add,rd,v1,v2)
→ Proc(pc,rf[rd:=v],bs',im,dm)
    where v=v1+v2
        bs'=deq(bs)
Bz-taken rule 330:
Proc(pc,rf,bs,im,dm)
if first(bs) is Bz(vc,va) AND vc is 0
→ Proc(va,rf,<empty>,im,dm)
Bz-not-taken rule 340:
Proc(pc,rf,bs,im,dm)
if first(bs) is Bz(vc,va) AND vc is not 0
→ Proc(pc,rf,bs',im,dm)
        where bs' is deq(bs)
```

The Source( ) Function is a shorthand for extracting the set of source register names from an instruction or a set of instructions. For example Source(Op(Add,rd,r1,r2))={r1, r2}. The Target( ) function is a shorthand for extracting the set of destination register names from the instructions in bs. The Decode( ) function is a shorthand for the decoded version of an instruction where the register operands has been fetched. For example, Decode(Op(Add,rd,r1,r2))=Op(Add,rd,rf[r1], rf[r2])

Notice that Fetch rule 310 is always ready to fire, unless there is a Read-After. Write register dependence in the instruction being issued and the instructions waiting to be completed in bs. If Bz-taken rule 330 is also ready to fire when the Fetch rule is ready to fire, the asynchronous system exhibits non-deterministic behavior since one of these two will be applied and the corresponding state transition will complete before the other rule is applied (if indeed it is still applicable after the first state transition).

Referring to FIG. 3B, each rule in the second example is illustrated with its dependency on values in particular storage elements and with its affect on values in storage elements. Note that Add rule 320, Bz-taken rule 330, and Bz-not-taken rule 340 all affect storage element BS 350, in particular by dequeuing the next instruction from the FIFO. However, these three rules are enabled in disjoint sets of states, in particular, no instruction in BS 350 enables more than one of the rules. However, Fetch rule 310 and Bz-taken rule 330 both update PC 240. Furthermore, there are states in which both rules are enabled, in particular, whenever Bz-taken rule 330 is enabled when Bz-taken is enabled and it is the only instruction in BS. The approach of specifying a synchronous implementation of the rules enabling all the rules in each clocking period does not necessarily produce the expected result. For instance, the race condition of writing the updated value of PC 240 can result if both Fetch rule 310 and Bz-taken rule 330 each enable state transitions that occur in one clocking period. As is described below, an overall strategy used in Term Rewriting Architecture Compiler (TRAC) 130 (FIG. 1) is to attempt to enable multiple rules in each clocking period, without introducing conflicts such as the race condition in updating PC 240 outlined above.

4 Compilation

Figure 4:
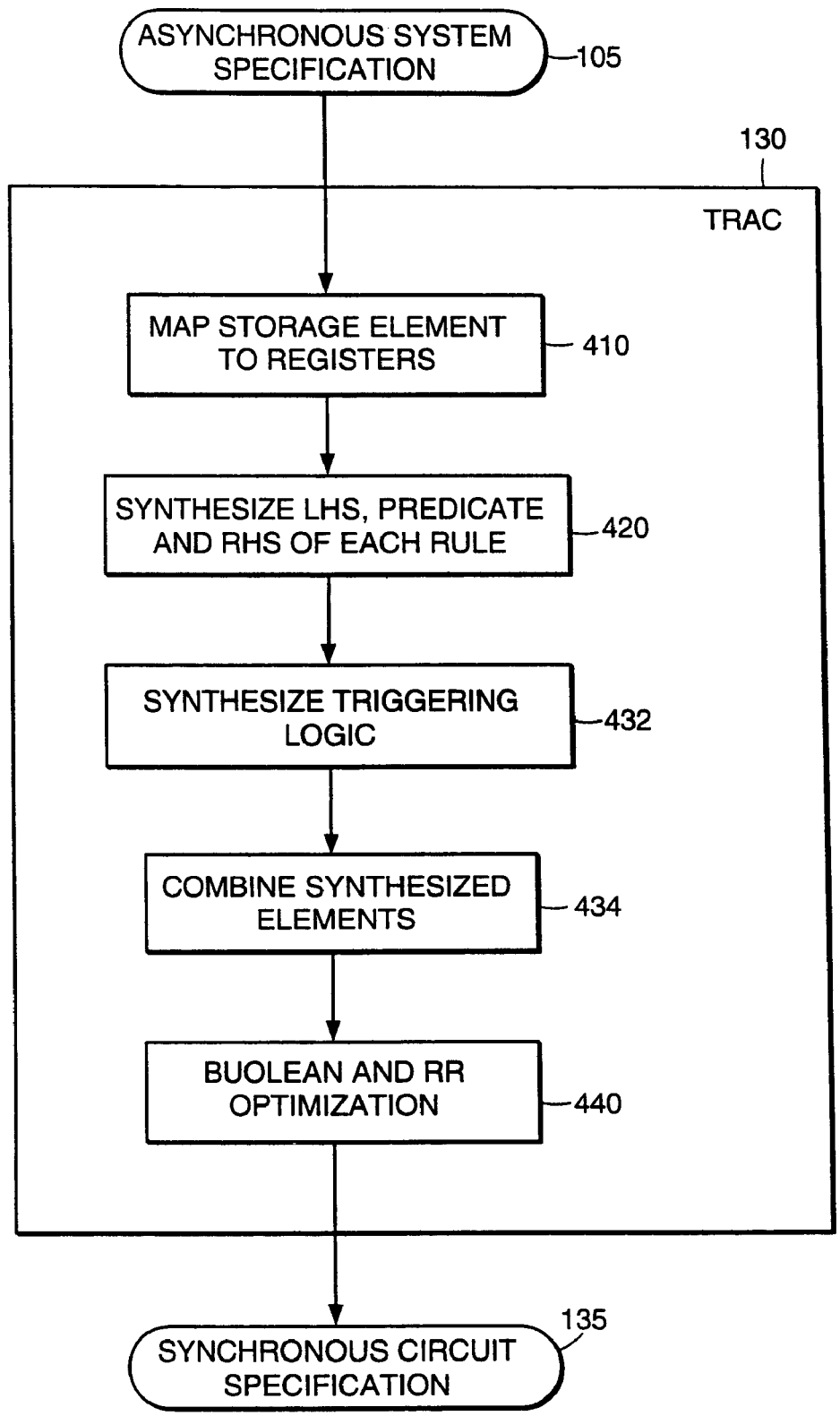
FIG. 4 is a flowchart of the steps carried out by a Term Rewriting Architecture Compiler.

Referring now to FIG. 4, operation of an embodiment of Term Rewriting Architecture Compiler (TRAC) 130 (FIG. 1) involves several steps. Note that the steps are not necessarily performed in the sequence illustrated in the figure, as some steps can be performed in parallel. First, in step 410, TRAC 130 maps the storage elements specified in asynchronous system specification 105 (FIG. 1) into registers, or other predefined circuit elements that provide storage of values within the synchronous circuit. Next, in step 420, TRAC 130 synthesizes enabling logic from the LHS and predicate and updating logic from the RHS of each rule in an internal representation that is essentially equivalent to logic circuits needed to implement these terms. Note that these logic representations associated with each rule are "disconnected" and do not form an overall circuit representation at this step. In step 432, TRAC 130 synthesizes rule arbitration and update combination logic and in step 434 connects the logic synthesized in steps 420 and 432 with the logic synthesized in step 434 to form an overall specification of the synchronous circuit. Then in step 440, TRAC 130 optimizes the resulting logic producing the final RTL specification. These steps are considered in more detail as follows.

Returning to step 410, TRAC 130 maps storage elements in asynchronous system specification 105 into a variety of actual circuit elements that will hold the values that determine the state of the system. In the case of scalar storage elements, the mapping is directly into a register circuit. Asynchronous system specification 105 includes data type declarations for each of the storage elements. For example, in the case of scalar storage elements can include the number of bits needed in the register circuit. Alternatively, a default number of bits (e.g., 32 bits) can be used. In the case of abstract storage elements, such as a register file or a FIFO queue, TRAC 130 maps these elements into predefined circuit elements that are, for example, provided as library elements in the HDL.

Although an abstract data type may describe an unbounded storage, such as an unbounded length FIFO queue, the circuit elements have bounded storage. In the case of a FIFO queue, at this step TRAC 130 synthesizes circuitry which implements storage for one or more entries, as well as interlocking circuitry prevents writing into a full FIFO. Note that in an asynchronous system, a full FIFO cannot be written to. In a synchronous implementation, a full FIFO can be written to in a clocking period as long as an entry is dequeued in the same period. In this way, a FIFO queue may be implemented using a single register and interlocking logic that prevents writing into the register only if the resister is holding a value that has not been dequeued, and that value is not dequeued in the clock period. Using this approach, the specification of the asynchronous system in terms of an unbounded FIFO is not complicated by including the function of the interlocking logic in each rule that may enqueue a value in the FIFO, while ensuring proper operation for the synchronous system which uses a finite length FIFO, or even a single register.

Optionally, at step 410, TRAC 130 optimizes storage by identifying particular storage elements that can share registers, thereby reducing the amount for storage circuitry that is needed in the synthesized circuit.

In step 420, TRAC 130 synthesizes logic to implement the LHS and predicate and the RHS of each rule. Formally, for a rule i, TRAC 130 synthesizes logical expressions, $\pi_i(s)$ and $\delta_i(s)$. The term s represents the state of the system, that is, the values in all the storage elements. The term $\pi_i(s)$ is a logical (Boolean) function that is true if rule i is enabled in state s, that is, if the rule's predicate is true, and the LHS of the rule matches the state. The term $\delta_i(s)$ defines the updated values for the storage elements, that is, the next state, if the rule is applied.

An equivalent characterization of a rule i by the state-to-state transition function $\delta(s)$ is a characterization by a set of actions, $\alpha$, on the storage elements $<R_1, \ldots, A_1, \ldots, F_1, \ldots>$ (i.e., registers, arrays, and FIFOs) that make up the state, where each storage element is associated with a corresponding action, $\alpha = <a^{R_1}, \ldots a^{A_1}, \ldots a^{F_1}, \ldots>$, and some actions are null, indicated symbolically as $\epsilon$. Then $\delta(s)$ is equal to the result of applying the actions specified in $\alpha_i$ to each of the storage elements.

In step 432, TRAC 130 generates scheduling logic for the rules. That is, TRAC generates logic that accepts enable signals identifying which rules are enabled given the current state, and outputs trigger signals that trigger a particular subset of those rules such that the rules in the subset can be applied in a single cycle of the synchronous circuit. A variety of alternative approaches to this step are described below. These alternatives can also be combined in yet other alternative approaches.

As outlined above, TRAC 130 identifies sets of state transition rules of the asynchronous system that can be statically determined to be applicable within a single cycle of the synchronous circuit. These sets are termed "scheduling groups" of rules. TRAC 130 does not necessarily explicitly enumerate all these scheduling groups. For example, in various approaches describe below, TRAC computes quantities (sets, graphs, etc.) from which scheduling groups can be determined constructively. Also, in various approaches described below, these scheduling groups are identified based on a static analysis of the system in which TRAC determines whether rules can be applied in a single synchronous cycle regardless of the state of the system. This static analysis is somewhat conservative in that, depending on the state of the system, additional rules might be applicable. However, since the scheduling groups do not depend on the state of the system, the implementation of the synchronous circuit is typically simpler than if the state of the system were taken into account to determine which rules could be applied within a single cycle. The use of a static analysis is not an absolute requirement in related alternative approaches.

4.1 Single Rule Per Cycle

A first approach to synthesizing the arbitration and update combination logic designing the synchronous circuit to apply at more one enabled rule in any particular cycle. Since only a single rule is triggered, there is no conflicting access to storage elements form different rules that are triggered concurrently. Conceptually, each scheduling group has a single rule in it and there is one such scheduling group for each rule. In order to maintain fairness among which rule is selected for triggering, TRAC 130 synthesizes a round-robin priority encoder that accepts the $\pi_i(s)$ signals, and outputs trigger signals $\phi_i(s)$ such that the corresponding enable signal is asserted and at most a single of the trigger signals is asserted. For each storage element that can be updated by more than one rule, TRAC 130 generates update selection logic that includes a selector that chooses the output of the update logic for the triggered rule to update that storage element. This approach may be relative inefficiency of applying at most one rule per cycle in the synchronous circuit. However, the approach also has the advantage of generating relatively little logic, which results, for example, in relatively little circuit area used by arbitration and update combination logic in an integrated circuit.

4.2 Conflict-Free Enumeration

In second approach to generating triggering logic TRAC 130 explicitly enumerates a number of scheduling groups. This list may be exhaustive, or alternatively, may represent a subset of all possible scheduling groups. TRAC makes use of a "conflict-free" condition between pairs of rules to form the enumerated scheduling groups. Essentially, a two rules are conflict free if there is no state in which both can be enabled, or if there is such a state, the two rules can be applied "in parallel" without affecting one another. TRAC forms the enumerated scheduling groups by requiring that all pairs of rules in any particular group are conflict-free.

For any pair of rules that are or may possibly be both enabled in a state, then for the rules to be known to be conflict-free, the order of applying the two rules in sequence should not affect the resulting state transition after applying both rules. First, for any state in which both rules are enabled, each rule must continue to be enabled after the state transition defined by the other rule. Second, the order of the state transitions must not affect the resulting state after both transitions. The storage elements that are updated by the RHS terms of the rules are compared, and if there is any storage element in common, the two rules are assumed to be in conflict. Even if there are no storage elements in conflict, if the result of performing the state update specified by the RHS term of one rule might affect the result of performing the state update of the other RHS term, for example by modifying the operands of that RHS term, then the two rules are also assumed to be in conflict. In this way, essentially parallel execution of two conflict-free state update in a single cycle is equivalent to sequential execution triggering the two state updates.

This conflict-free condition between two rules can be stated formally as follows. Consider two rules, i and j. Let s be the state of the system in terms of the values in all the storage elements of the system. As outlined above, the logical function $\pi_i(s)$ is true for a state s if the LHS terms and the predicate for rule i would enable the state transition defined by rule i, and the value of the state after that transition would be $\delta_i(s)$.

Two rules cannot both be enabled in any state s if $\pi_i(s)\char`^\pi_j(s)$ is false for all states s, and therefore would not be in conflict. If $\pi_i(s)$ and $\pi_j(s)$ are both true for some state s, then both $\pi_i(\delta_j(s))$ and $\pi_j(\delta_i(s))$ must also be true to satisfy the requirement that both rules remain enabled after the state transition enabled by the other rule. Furthermore, the effect of the updates must not depend on the order of the updates, $\delta_i(\delta_j(s))=\delta_j(\delta_i(s))$, which is the case if the two rules update different storage elements and one rule does not update the operands of the other rule's RHS term. Note that concurrent application of a set of non-conflicting rules in a synchronous implementation is equivalent to any sequence of application of those rules in the specified asynchronous system.

In this conflict-free enumeration approach, TRAC 130 enumerates the scheduling groups, and synthesizes triggering logic that accepts the enable signals and outputs trigger signals which correspond to an intersection of the enabled rules and the rules in a single of the scheduling groups. For example, this can be implemented using combinational logic that implements the intersection. The scheduling groups that have at least some rule intersecting with the enabled rules are selected by a round-robin priority encoded, optionally giving preference to those scheduling groups that would result in the largest number of rules being triggered. TRAC 130 synthesizes update combination logic that is similar to that in the approach in which only a single rule is triggered per cycle, since the scheduling groups are chosen such that for any storage element, at most a single rule updates that storage element per cycle.

This approach has an advantage of triggering a relatively large number of rules per cycle, and a disadvantage that the portion of the scheduling logic that encodes the scheduling groups using a relatively large amount of circuitry for systems that have more than a small number of rules.

4.3 Potentially Conflicting Sets

Another approach taken by TRAC 130 to synthesize arbitration and update combination logic involves partitioning the rules into disjoint sets of potentially conflicting rules. Each rule in any such set of more than one rule possibly conflicts with at least one other rule in that set, that is, the TRAC 130 has not determined with certainty that the two rules are conflict free. Also, any rule in such a potentially conflicting set is known to be conflict free with all rules outside that set. Therefore, in any clocking period, one rule from each set of potentially conflicting rules can safely be triggered simultaneously without conflict. TRAC 130 synthesizes arbitration logic that is used to prevent more than one rule in each potentially conflicting set from being triggered concurrently in one clocking period. This arbitration logic implicitly encodes membership in these potentially conflicting sets as well as implicitly encoding the set of scheduling groups.

Sets of potentially conflicting rules are identified in two steps. In one alternative approach each pair of rules is examined to determine whether there are any state of the system in which both rules are be enabled. TRAC 130 does this by examining the LHS terms and predicates of each of the pairs of rules and logically proving that a state exists that would enable both rules. In another alternative, rather than definitely proving that a state exists that enables both rules, a conservative approach is taken in which if TRAC 130 cannot prove that definitely no state exists that enables both rules, it assumes that such a state may possibly exist.

In the conservative static assessment of the conflict-free property based on the domain of the precondition and the domain and range of the action associated with each rule. The domain of an expression, such as a precondition $\pi$ or an argument of an action is defined as the union of the domains sub-expressions. The domain for accessing functions for particular storage elements are defined in this embodiment as follows. The domain of a register get( ) is the register. The domain of an array a-get(indx) is the union of the array and the domain of the index indx. The domain of a FIFO first( ) or empty( ) function is the head of the FIFO, while the domain of a FIFO full( ) function is the tail of the FIFO (that is, the head and tail are treated separately in this domain and range analysis). The ranges of actions are similarly defined. The range of a set(-) or a-set(-,-) action is the register or array updated by the action. The range of a FIFO enqueue(-) is the tail of the FIFO, the range of a dequeue is the head of the FIFO, and the range of an enqueue-dequeue(-) (a concurrent enqueue and dequeue) and a clear( ) are both the head and tail of the FIFO. Based on these definitions of the domain and range of expressions and actions, the conservative static assessment of the conflict-free property is that if the ranges for two rules do not intersect, and the domain of one rule does not intersect with the range of the other, then the two rules are declared to be known to be conflict-free. Furthermore, if two rules i and j are mutually exclusive, that is $\pi_i(s)\char`^\pi_j(s)$ is false in all states s, then these rules are also declared to be conflict-free by default. In this embodiment, a conservative assessment of the mutual exclusive property searches the two expressions for $\pi$ for contradicting constraints on any one state element, although a more detailed analysis can alternatively be performed.

Next, the rules are partitioned into potentially conflicting sets by first forming a conflict graph with the nodes representing the rules. The arcs of the graph each correspond to a pair of rules that have not been declared conflict free. Each connected set of states forms a potentially conflicting set. Two rules in different potentially conflicting set must have been declared conflict free or else the groups would be connected. Note that in this partitioning, it is possible for two rules within one group to actually have been declared conflict free. For instance, if rule A has not been declared conflict free with rules B and C, but B and C have been declared conflict free, all three rules would still be included in a single scheduling group.

Figure 6A:
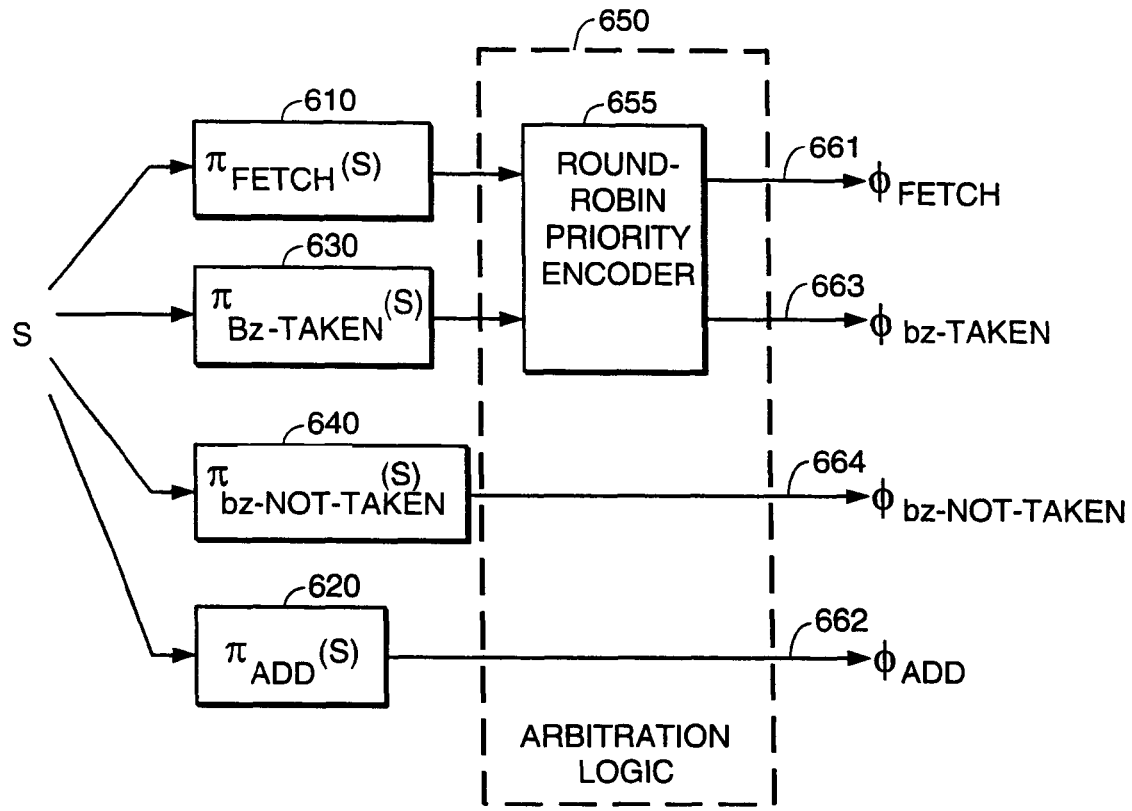
FIGS. 6A-B illustrate arbitration logic which generates trigger signals for rules.

Having identified the potentially conflicting sets of rules, TRAC 130 generates arbitration logic of a structure illustrated in the example shown in FIG. 6A. That is, for each potentially conflicting set with two or more rules TRAC 130 inserts a round-robin priority encoder to trigger at most one rule from each of the potentially conflicting sets.

Figure 14:
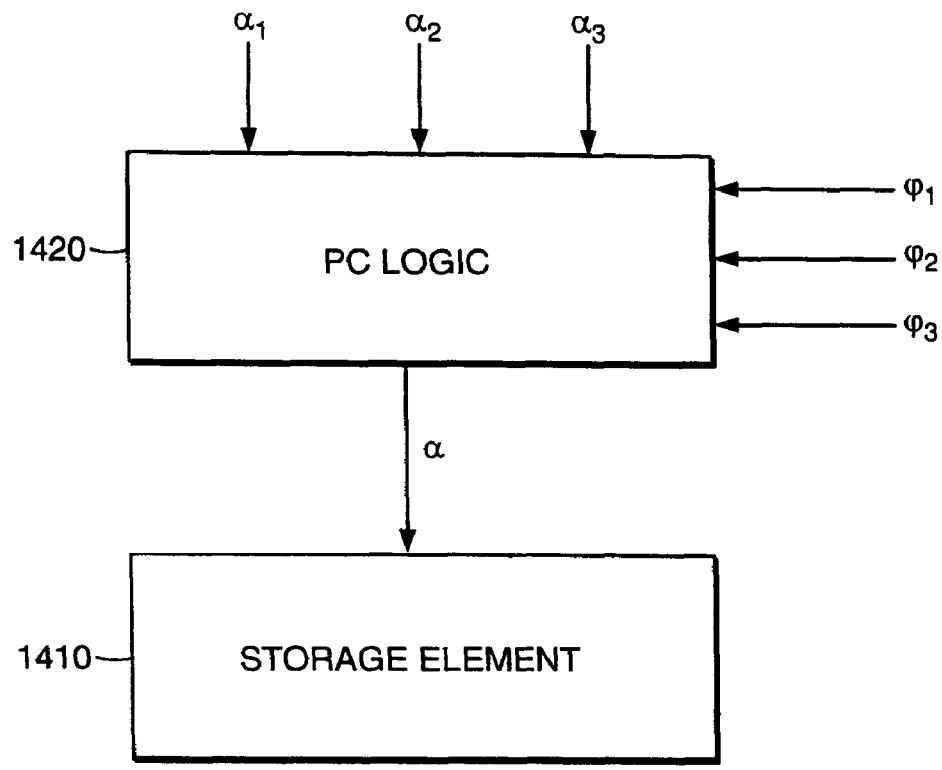
FIG. 14 is a block diagram of update combination logic for a parallel combination of rules.
Figure 15:
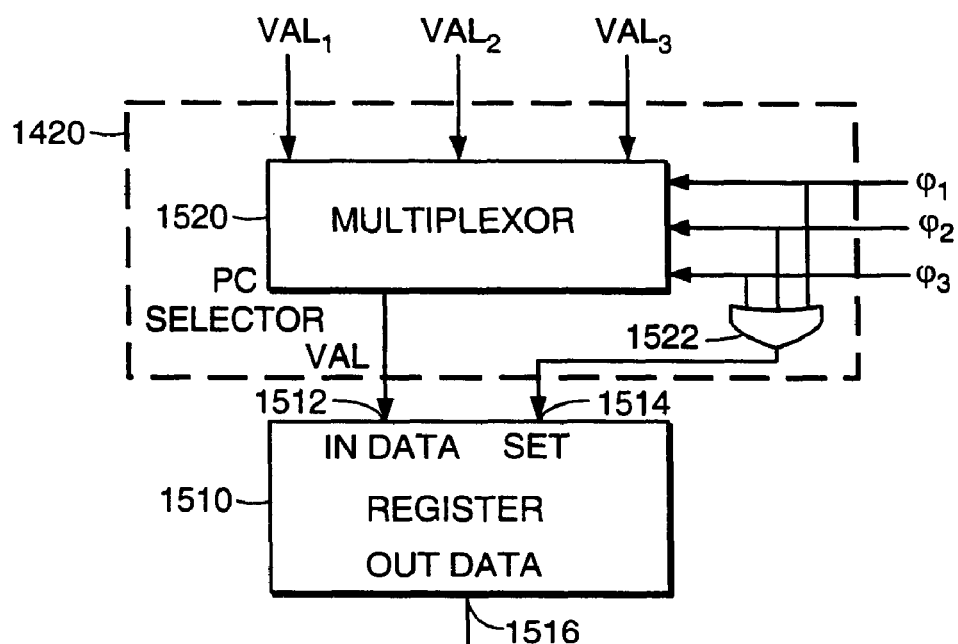
FIG. 15 is a circuit diagram for update combination logic for a parallel combination of set actions for a register storage element.

TRAC 130 generates update combination logic for each storage element based on the data type of the storage element, and the nature of the potential conflict. Referring to FIG. 14, a general structure for the update combination logic associated with a storage element 1410 is a parallel update combination (PC) logic 1420 accepts signals that correspond to a number of actions, illustrated as $\alpha_1, \alpha_2$, and $\alpha_1$, and outputs to the storage element a signal corresponding to the parallel combination of those actions based on the trigger signals $\phi_1$, $\phi_2$, and $\phi_3$ that are generated by the scheduling logic. For example, if rules 1, 2, and 3 have a range conflict, then at most one of the trigger signals is asserted and the parallel combination of the actions corresponds to the triggered action. Referring to FIG. 15, such a range conflict is illustrated for a register storage element 1510 for which the action is passed to the register through an input data port 1512 and a set line 1514. PC logic 1420 corresponds in this case to a multiplexer 1520 that selects from the values associated with the three rules, and OR logic 1522 that asserts set line 1514 if any of the three rules is enabled.

Figure 16:
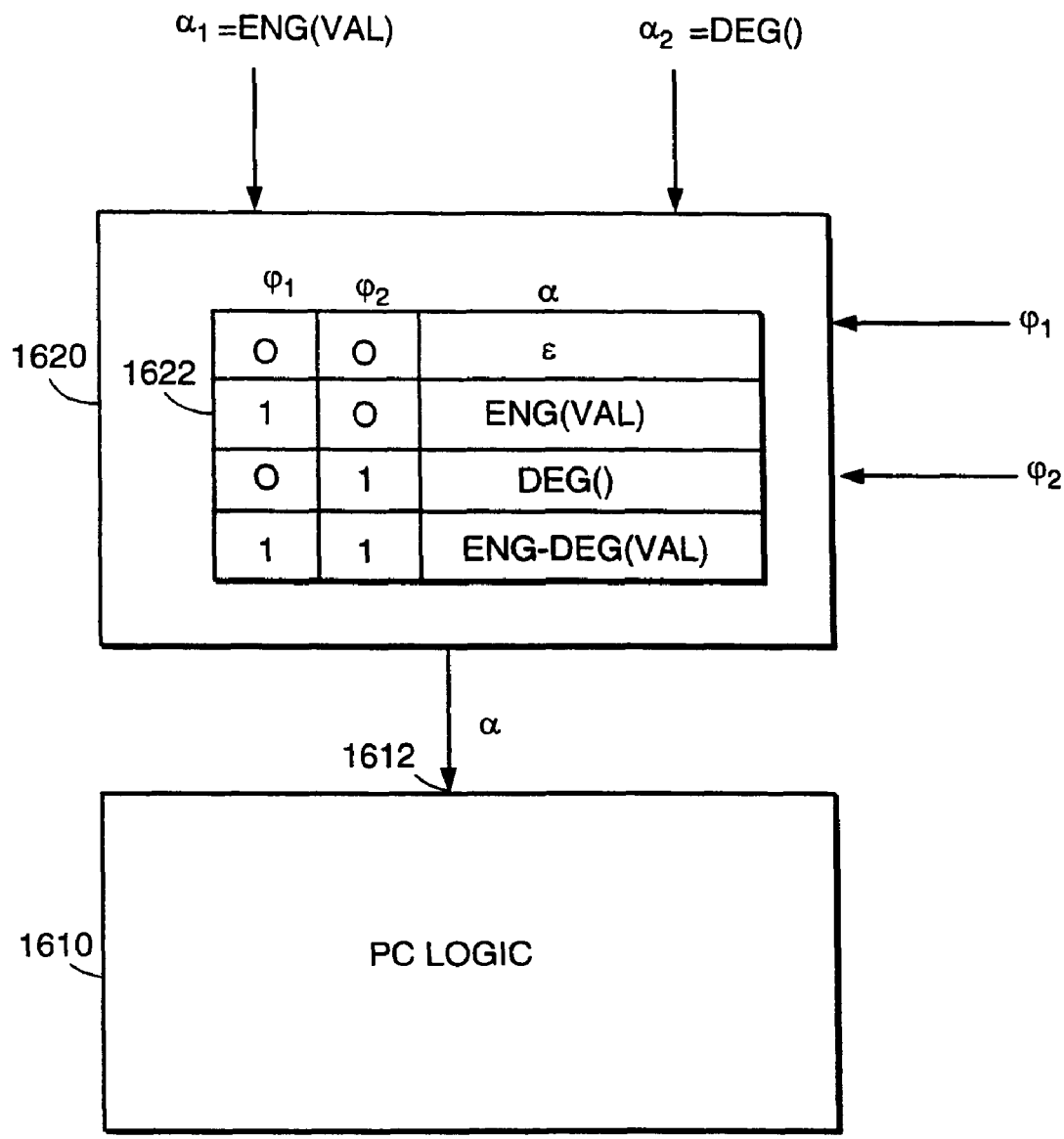
FIG. 16 is a diagram for update combination logic for a parallel combination of actions for a FIFO storage element.

Referring to FIG. 16, the PC logic for a FIFO may modify the action by combining actions of several rules. Recall that access to the head and the tail of a FIFO do not necessarily conflict, and that one rule may perform an enqueue(val) action and another rule may perform a dequeue( ) action on the same FIFO in the same clocking period. In FIG. 16, a FIFO 1610 accepts an action signal at a port 1612, which includes the function to perform as well as any value that should be enqueued. PC logic 1620 in this example generates the action signal to pass to FIFO 1610 according to a table 1622. Note that both rules may be triggered, indicating that concurrent enqueue(val) and dequeue actions have been scheduled, and PC logic 1620 in this case outputs a combined enqueue-dequeue(val) action to the FIFO.

Figure 17:
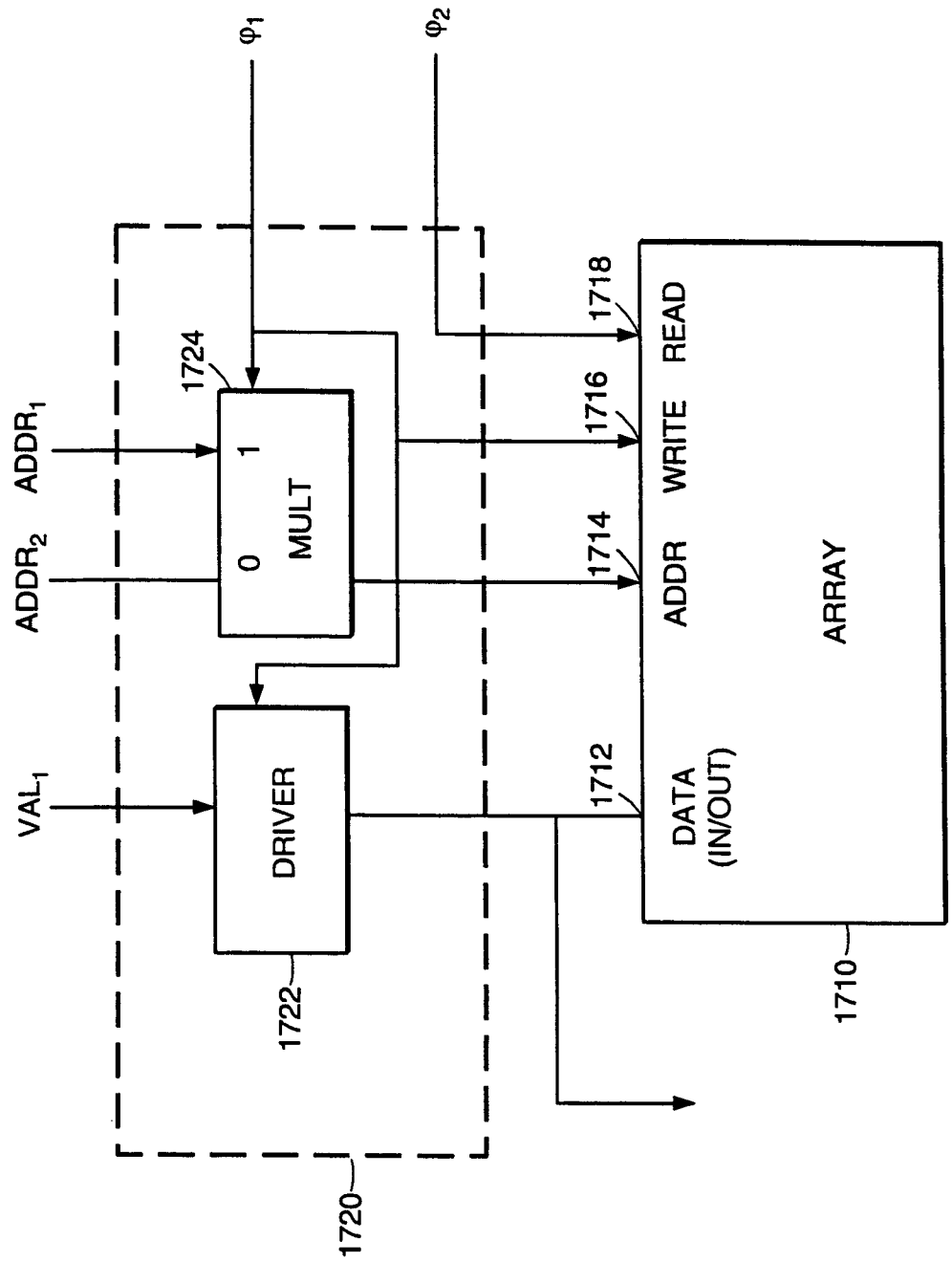
FIG. 17 is a diagram for update combination logic for a parallel combination of actions for an array storage element.

Referring to FIG. 17, a potential conflict may also arise through a conflict between a range of one rule and a domain of another. In FIG. 17, rule 1 performs an a-set($addr_1, val_1$) action on an array storage element 1710 while rule 2 makes use of an a-get($addr_2$) expression. In this example, array 1710 has a shared input/output data port 1712 and a shared address port 1714. PC logic 1720 include a driver 1722 that drives data port 1712 only if rule 1 is enabled, and a multiplexer 1724 that selects between $addr_1$ and $addr_2$ depending on which rule is enabled.

4.4 Enumeration in Potentially Conflicting Set

Another alternative approach combines the enumeration approach and with partitioning into potentially conflicting sets. TRAC 130 synthesizes scheduling logic that can trigger more than one rule from a potentially conflicting set. For example, consider the case in which a rule A potentially conflicts with rule B and separately potentially conflicts with rule C, but rules B and C are conflict free. Rules A, B, and C belong to a common potentially conflicting set. In the approach described above in Section 4.3 in which at most one rule from each potentially conflicting set is triggered, at most one of rules A, B, and C are triggered, thereby not allowing both A and B or both A and C to be triggered, but also not allowing both rules B and C to be triggered either. In this alternative approach, within each potentially conflicting set of rules, TRAC 130 enumerates conflict-free scheduling subgroups such that the rules in a subgroup all come from one potentially conflicting set of rules, and all pairs of rules in the subgroup are known to be conflict-free. In this way, {B,C} is a scheduling subgroup and if both B and C are enabled, they can both be triggered. Conceptually, the scheduling groups of the overall system are all combinations of the enumerated scheduling subgroups associated with the potentially conflicting sets of rules.

This approach has an advantage of being able to triggering more than one rule per cycle, and to trigger more than one rule per potentially conflicting set of rules, without requiring the scheduling logic to encode the entire set of scheduling groups of rules. Rather, the scheduling logic encodes the separate sets of scheduling subgroups resulting in typically less circuitry being associated with the scheduling logic than in the full enumeration approach.

In alternative versions of this approach, an enumeration approach is not necessarily used for each potentially conflicting set. For instance, TRAC 130 may synthesize a round-robin encoder for some potentially-conflicting sets and exhaustively enumerate conflict-free scheduling subgroups for other potentially-conflicting sets. In one such approach, a designer may identify portions of the asynchronous system as portions in which the additional circuitry used by exhaustive enumeration is desirable to obtain potentially increased parallelism in the synchronous circuit, while in other portions less circuitry with a loss of potential parallelism is desirable. Also, the enumeration approach does not have to be exhaustive. For example, a designer may explicitly identify sets of rules that he would like to have concurrently applied in single cycles of the synchronous circuit, and TRAC then identifies scheduling subgroups that have as many of those rules as possible in them. Other approaches to partial enumeration are also possible, for example based on a constraint on the number of subgroups, or the amount of circuitry that results from synthesizing the arbitration logic based on the enumeration.

4.5 Dominance

Even when two rules potentially conflict, and state transitions are enabled by these rules both update the same storage element, one rule may "dominate" the other. For instance, if two rules may both be enabled in some states, that is, $\pi_i(s)$ ^$\pi_j(s)$ is true in states s, if $\pi_i(\delta_j(s))$ is true and $\delta_i(\delta_j(s))=\delta_i(s)$ for all states s for which both are enabled, then rule i is said to dominate rule j since even if rule j were to be enabled, subsequent firing of rule i would erase the effect of the prior firing of rule j. Therefore, conceptually, rule i can be applied after rule j in a clocking period in which both would be enabled. In the case of a synchronous circuit, if both rules i and j would enable state transitions, only the dominant state transition is triggered and the result is equivalent to having performed the dominant state transition after the other state transition.

TRAC 130 synthesizes arbitration logic such that if both rules i and j are enabled, the arbitration logic produces the same set of trigger signals as if only the dominant rule were enabled.

4.6 Second Example (Continued)

Figure 5:
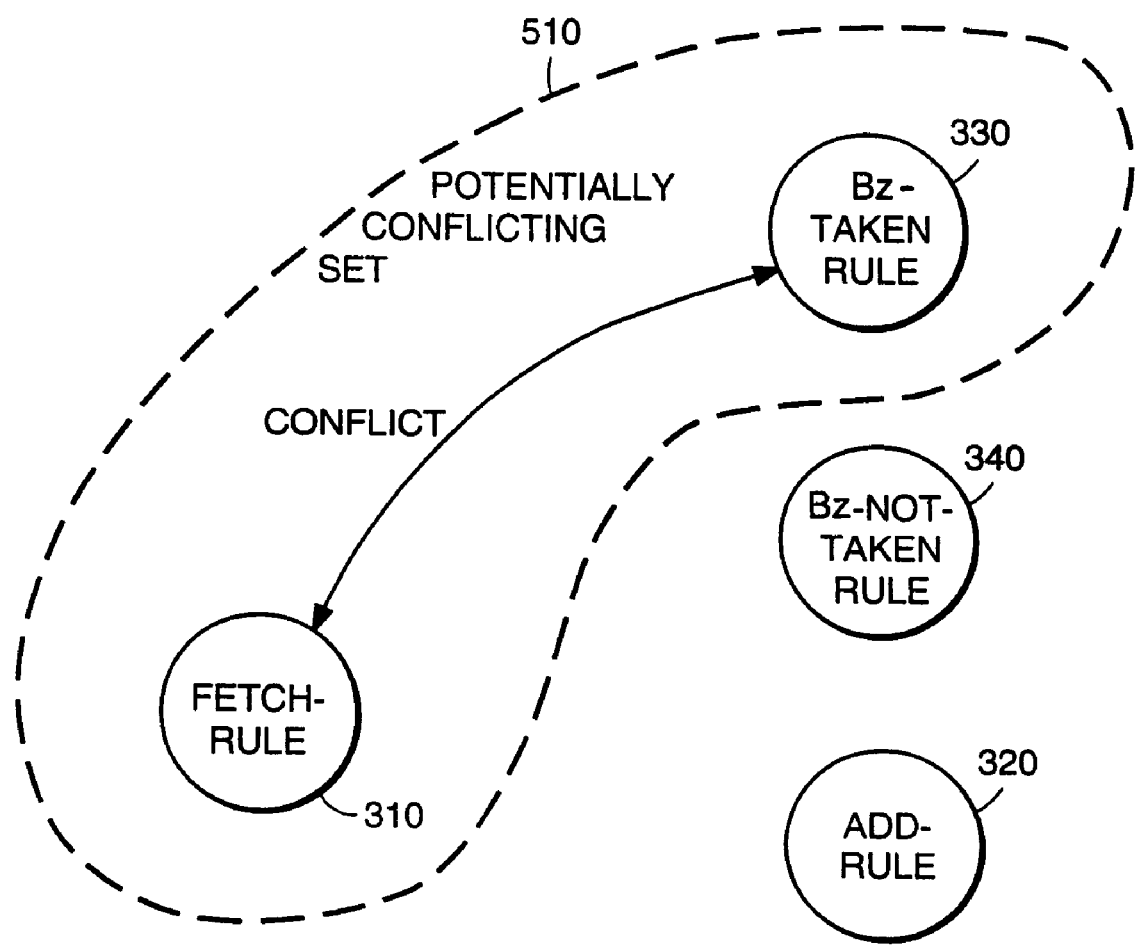
FIG. 5 illustrates exemplary sets of potentially conflicting rules.

Returning to the second example illustrated in FIG. 3B and introduced in Section 3, the conflict free relationship for the exemplary rules is illustrated in FIG. 5. Fetch rule 310 and Bz-taken rule 330 conflict because of the race updating PC 240 (FIG. 3B). Potentially conflicting set 510 is made up of fetch rule 310 and Bz-taken rule 330. The remaining rules do not conflict with any other rules.

Note that Bz-taken rule 330 dominates Fetch rule 310 under the definition stated above, and therefore in states in which both rules would enable state transitions, only Bz-taken rule 330 need be executed.

Turning to FIG. 6A, TRAC 130 synthesizes arbitration logic 650 according to the approach described in Sections 4.3 and 4.5. The arbitration logic takes as input enable signal $\pi_i(s)$ from each rule i, and outputs $\phi_i(s)$, a trigger signal for each rule i. The $\phi_i(s)$ are such that for any potentially conflicting set of rules, at most one rule from that set has a trigger signal asserted. That rule is selected in a fair manner, for example in a priority round-robin manner 655, from the rules in the set for which $\pi_i(s)$ is true. Arbitration logic 650 also takes into account dominance of one rule over another so that if dominant rule and the dominated rule can both fire, the dominant rule is chosen over the dominated rule, regardless of fairness. In FIG. 6, which corresponds to the second example above, combinational logic 610, 620, 630, and 640, implements $\pi_{Fetch}(s), \pi_{Add}(s), \pi_{Bz\text{-}taken}(s)$ and $\pi_{Bz\text{-}not\text{-}taken}(s)$, respectively.

Referring still to FIG. 6A, the $\pi_i(s)$ signals are fed to arbitration logic 650. In this example, there is only one set of potentially conflicting rules, which includes the Fetch rule and the Bz-taken rule. Therefore the outputs $\pi_{Fetch}(s)$ from combinational logic 610 and $\pi_{Bz\text{-}taken}(s)$ from combinational logic 630 are fed to round-robin priority encoder 655. In this single example, the dominant relationship between Bz-taken rule 330 and Fetch rule 310 is used to trigger Fetch rule 310 unless Bz-taken rule 330 is also to be triggered.

Figure 6B:
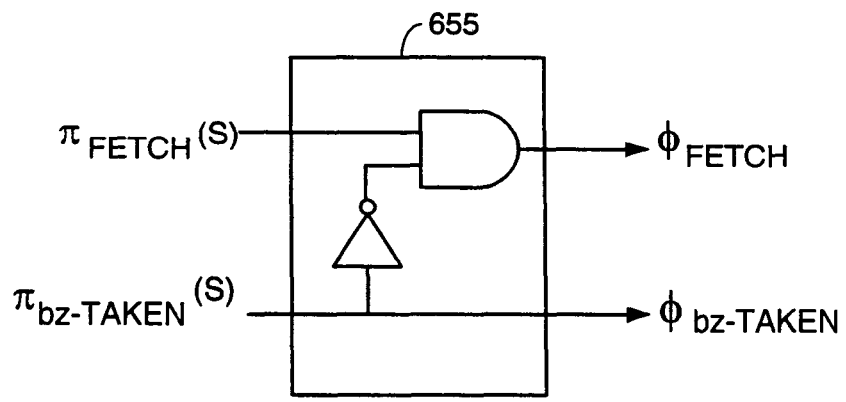

Referring to FIG. 6B, arbitration logic 650 for this example is particularly simple, with the Fetch rule being arbitrated only if the Bz-taken rule is enabled, and arbitration logic 650 generating trigger signals for the other rules whenever they are enabled.

In a final part of step 430, TRAC 130 combines the outputs trigger signals $\delta_i(s)$ through multiplexers that are used to select the outputs of appropriate $\delta_i(s)$ functions which the multiplexers then feed the selected output to the registers.

Figure 6C:
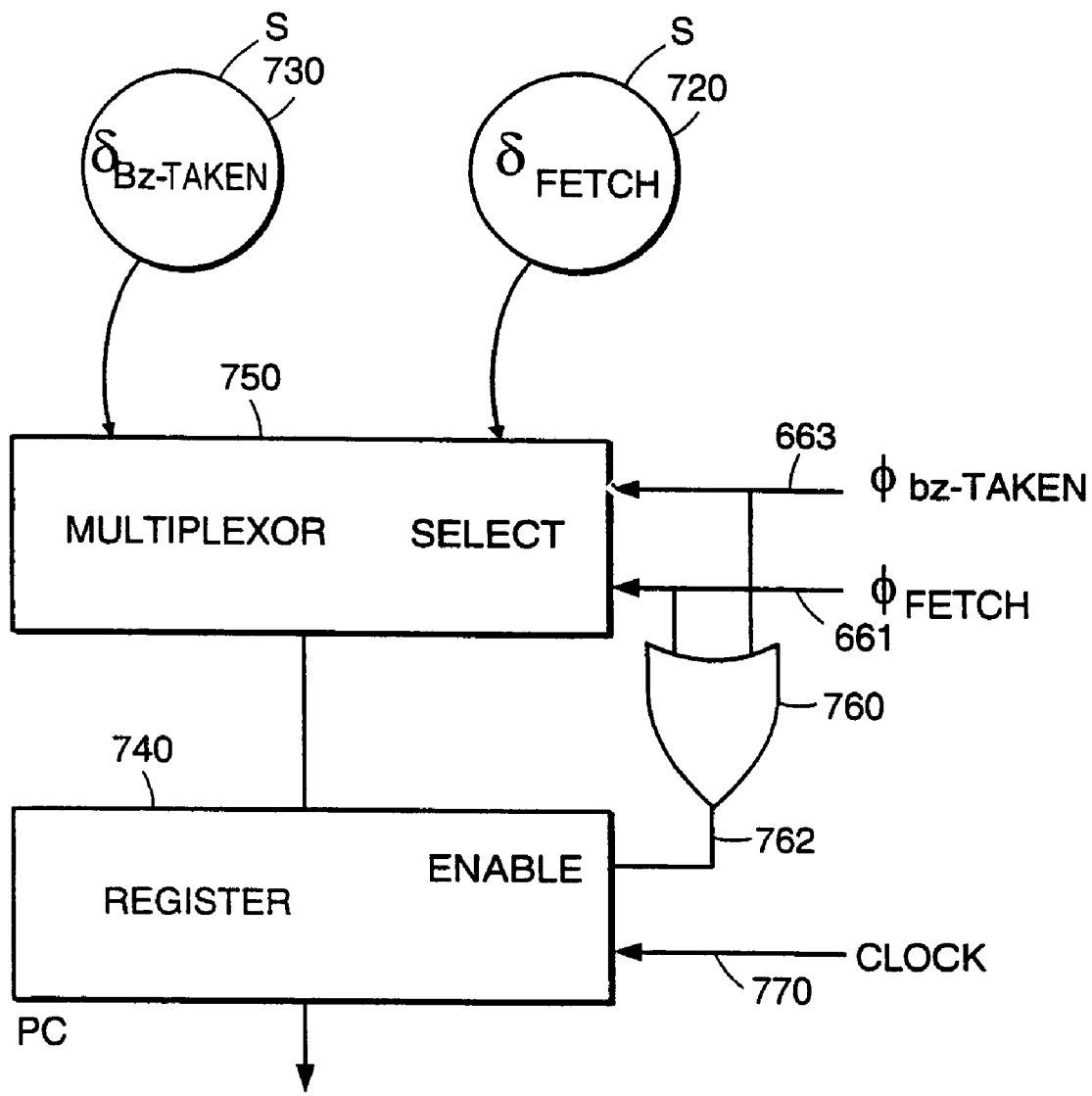
FIG. 6C illustrates a potion of a circuit specification which makes use of the trigger signals.

Referring to FIG. 6C, a portion of the resulting synchronous circuit specification 135 (FIG. 1) produced by TRAC 130 is shown for the second example above. Trigger signals $\phi_{Bz\text{-}taken}(s)$ 663 and $\phi_{Fetch}(s)$ 661 are generated by arbitration logic 650, as shown in FIG. 6A, and fed update combination logic that includes a multiplexor 750. In particular, the trigger signals are fed to the select inputs of multiplexor 750. Combinational logic 730, and 720, implementing $\delta_{Bz\text{-}taken}(s)$ and $\delta_{Fetch}(s)$, respectively, generate outputs that are fed to multiplexor 750. Multiplexor 750 selects one of these two outputs based on its select input, and feeds the selected signal to register 740, which implements storage for PC 240 (FIG. 2). Register 740 is enabled by a latch enable signal 762 that is generated by an OR logic 760 based on the trigger signals 661 and 663 that are fed to multiplexor 750. Register 740 also receives a clock 770 so that in a clock period in which either Bz-taken rule 330 or Fetch rule 310 are enabled, register 740 is updated with the appropriate one of $\delta_{Bz\text{-}taken}(s)$ or $\delta_{Fetch}(s)$.

4.7 Sequential Composition

In another approach by which TRAC 130 synthesizes rule arbitration and update combination logic, TRAC 130 makes associates transitions of the synchronous system with sequences of state transitions of the specified asynchronous system such that rules in such a sequence are not conflict free. Generally, the approach is to identify scheduling groups that are sequences of rules such that application of any subset of a sequence in the order specified by the sequence can be associated with a single synchronous transition of the synchronous system. For example, consider the case in which rule A uses the value of register X to update the value of register Y, while rule B does not use the value of register Y but does update the value of register X. There is a possible conflict between the update by rule B and the input by rule A. A valid application of rules A and B in a single synchronous transition would be one that is equivalent to application of rule A prior to rule B. Note that in this example, rules A and B are not conflict-free according to the definitions provided above: although $\pi_A(s)$ and $\pi_B(s)$ may both be true for some state s, $\pi_A(\delta_B(s))$ is not necessarily true, and $\delta_A(\delta_B(s))$ is not necessarily equal to $\delta_B(\delta_A(s))$.

The approach taken to generate logic from the rules can be best understood as first identifying pairs of rules that are "sequential composable" (also called "strongly transparent") and then forming the sequences of rules such that any rules in any sequence is sequentially composable with all rules later in that same sequence.

A rule A is sequentially composable with a rule B, denoted $A<_{SC}B$, if concurrent application of rules A and B in the synchronous system is functionally equivalent to sequential application of rules A then B in the asynchronous system. This property can be written as follows: if $\pi_A(s)^{\wedge}\pi_B(s)$ in a state s, then $\pi_B(\delta_A(s))$ must be true, and $\delta_B(\delta_A(s))$ must be equivalent to $\delta_{SC}(s)$, which is defined to be the functional equivalent of sequentially applying rule A and then rule B. Note that in general, $\delta_{SC}(s)$ is not necessarily a selection between $\delta_B(S)$ and $\delta_A(s)$. Note also that sequential composability is not symmetric. That is $A<_{SC}B$ does not imply $B<_{SC}A$. Also, the conflict-free condition between two rules A and B implies both $A<_{SC}B$ and $B<_{SC}A$, but $A<_{SC}B$ and $B<_{SC}A$ does not necessarily imply that A and B are conflict free.

TRAC 130 synthesizes arbitration logic such that given a set of applicable rules in a state, the triggered rules correspond to some valid sequence of rules according to the sequential composability property.

4.8 Composable Sequence Enumeration

In a first approach that takes advantage of sequential composability, TRAC 130 enumerates sequentially composable sequences of rules. TRAC 130 automatically synthesizes arbitration logic such that for each clocking period, of the set of rules that are enabled according to the state of the system, a subset of those rules that all belong to a single sequentially composable sequence are triggered. Each storage element that is updated by these rules is updated according to the functional equivalent of applying the subset of enabled rules in that sequence in the asynchronous system according to the order of the sequence. Note that in general, for a particular set of enabled rules, multiple different sequentially composable sequences can be used. In this first approach, TRAC 130 identifies "maximal" composable sequences of rules, which are composable sequences such that the set of rules in the sequence is not a subset of the rules in any larger composable sequence.

As a first step, TRAC 130 makes a conservative static deduction of the property. This static deduction uses a sufficient condition for $A<_{SC}B$. This condition has two parts. First, the range of rule A must not intersect with the domain of rule B (the union of the domain of $\pi_B$ and the domain of $\delta_B$). That is the "output" of rule A cannot affect the "input" of rule B. The domain and range of a rule are defined as in the assessment of the conflict-free condition in the first approach. The second part of the sufficient condition is that the sequential application of the rules must be well defined. To be well defined, the sequential application of the rules cannot act on the same storage element of the state of the system, with the exceptions that a register can be set by both rules and the later one affects the resulting value, and a FIFO storage element can always be cleared after another action on the FIFO resulting in an empty FIFO. These two exceptions result in fewer conflicts than using the definition of range conflict that is used in the analysis of the conflict-free condition. As in the conflict-free analysis, a FIFO storage element can have an enqueue and a dequeue applied in either order, that is, for the purpose of this analysis, the head and the tail of a FIFO are considered to be separate elements.

Next, TRAC 130 enumerates the maximal composable sequences according to the static deduction of the pairwise sequential composability property. TRAC 130 then synthesizes arbitration logic in a manner similar to that used with enumeration of conflict-free groups as discussed in Section 4.2. That is, the arbitration logic asserts trigger signals for an intersection of the enabled rules and the rules in a single of the maximal composable sequences.

TRAC 130 synthesizes update combination logic for each storage element such that the update is equivalent to the sequential application of the triggered rules in the order determined by the selected maximal composable sequence.

4.9 Composable Sequences in Conflict-Free Sets

As an alternative approach, TRAC 130 first partitions the rules into potentially-conflicting sets as described above in Section 4.3. TRAC 130 then enumerates maximal composable sequences for the rules in each of these potentially conflicting sets. It then synthesizes arbitration logic such that at most one maximal composable sequence is selected from each potentially conflicting set, and the set of triggered rules are the intersection of the enabled rules and the rules in the maximal composable sequences selected for each of the potentially conflicting sets.

TRAC generates update combination logic as described in Section 4.9. Note that for any storage element, the rules which update the storage element come from at most one potentially conflicting group and therefore involve at most a single of the maximal composable sequences for the potentially conflicting sets.

Note that conceptually, the scheduling groups are all interleavings of the maximal composable sequences for the different potentially conflicting sets, since the relative ordering of the rules in different potentially conflicting sets does not affect the state transition of the synchronous system.

4.10 Composable Sequence Subgroups

In another approach that makes use of sequential composability, TRAC 130 identifies subsets of each potentially conflicting set of rules, and within each of those subsets identifies an scheduling groups according to the conflict-free property described above.

TRAC 130 partitions each potentially conflict set of rules into a number of subsets. The goal is to make any two rules in different of these subsets to either be conflict-free, or to be sequentially composable. Furthermore, if there are more than two subsets, then for a group of rules one from each subgroup, there is statically determined order in which the rules can be applied to form a sequentially composable sequence.

This step is implemented as follows. For each potentially conflicting set, a first directed graph is formed with the nodes representing the rules in the set. The graph includes a directed arc from a node for a rule A to a node for a rule B if and only if $A<_{SC}B$. In general, this directed graph has cycles. A second directed graph is formed by removing a sufficient number of arcs from the first directed graph so that the second directed graph is acyclic. In a first version of this approach, the arcs to remove are selected so that the number of arcs in the second directed graph is maximal. Alternative versions do not necessarily yield a maximal subset of arcs. For example, the user of the compiler may have identified particular sequences of rules in the input specification as being desirable to execute concurrently in a single clocking period. Alternatively, simulation of operation of the circuitry is used to store data that allows choice of the acyclic graph to improve or optimize the average number of rules that are concurrently applied in a clocking period. Note that the resulting second directed graph is not necessarily fully connected.

A third undirected graph is formed from the second directed graph and the pairwise conflict-free property. In particular, the third graph again has nodes that each corresponds to a different rule in a potentially conflicting set. An arc between a node for rule A to a node for rule B is present in the third graph if and only if rules A and B not known to be conflict free, and there is neither an arc form A to B nor from B to A in the second directed graph. The connected components of the third undirected graph identify the subsets of the potentially conflicting set.

Next, TRAC 130 generates arbitration logic. As in the first approach, the arbitration logic for each potentially conflicting set is independent of the logic for the other potentially conflicting sets, since it is known that any rule in such set is necessarily conflict free with any other rule in another such set. In this second approach, the scheduling logic for each subnet is independent and for a particular potentially conflicting set is such that for a particular group of enabled rules in the set, the arbitration logic triggers at least one rule from each subset that has an enabled rule. An important aspect of this approach is that since the second directed graph is acyclic, all the rules in a potentially conflicting set can be statically ordered so that for any set of trigger signals asserted by the arbitration logic, each rule in the sequence is either conflict free or sequentially composable with each of the triggered rules later in the sequence.

Figure 18A:
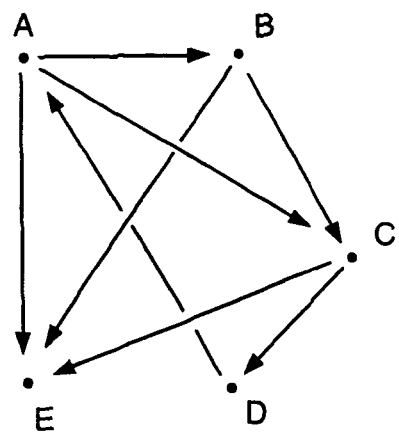
FIGS. 18A-C are graphs which are used identify scheduling sub-groups based on a sequential composability property.
Figure 18B:
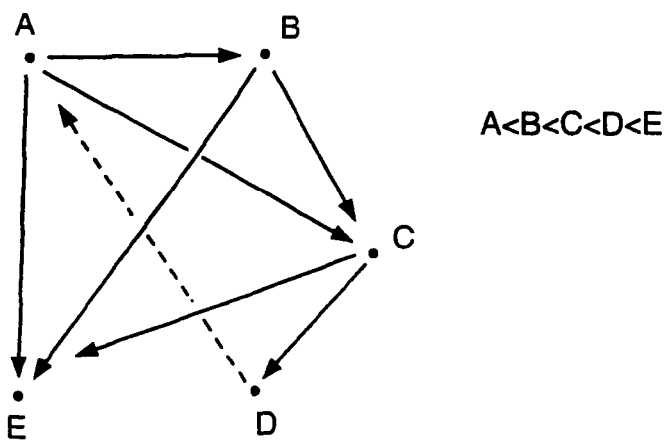
Figure 18C:
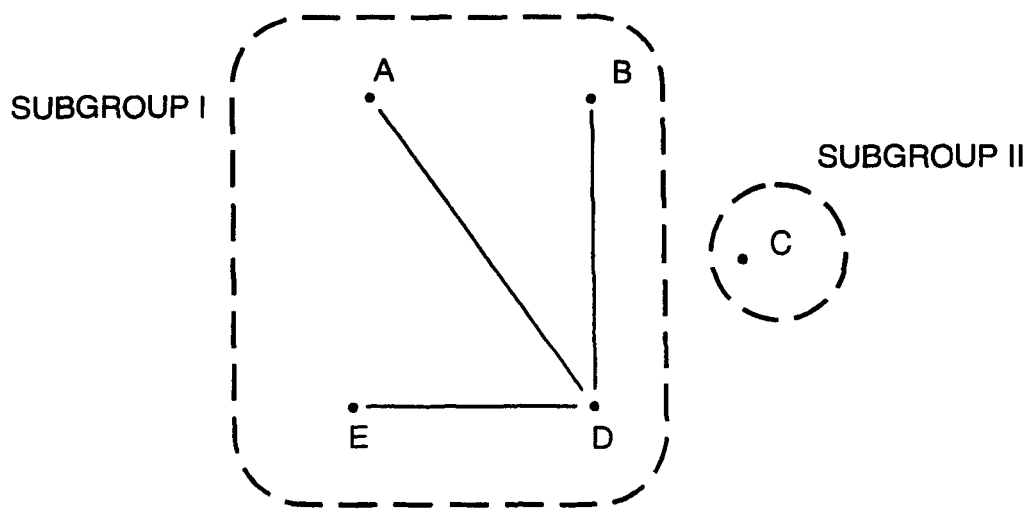

Referring to FIGS. 18A-C, in an example TRAC 130 partitions a scheduling group made up of five rules, A-E, into subgroups according to the above procedure. FIG. 18A shows the first directed graph that corresponds to the pairwise sequential composability properties of these rules. Note that this graph has cycles A-B-C-D and A-C-D. FIG. 18B shows the second directed graph in which the arc from D-E is removed (indicated by the broken arrow). The second directed graph has no cycles. FIG. 18C shows the third undirected graph (assuming that A-D, B-D, and D-E and not known to be conflict-free pairs of rules). The two sub-groups are therefore {A,B,D,E} and {C}.

Figure 19A:
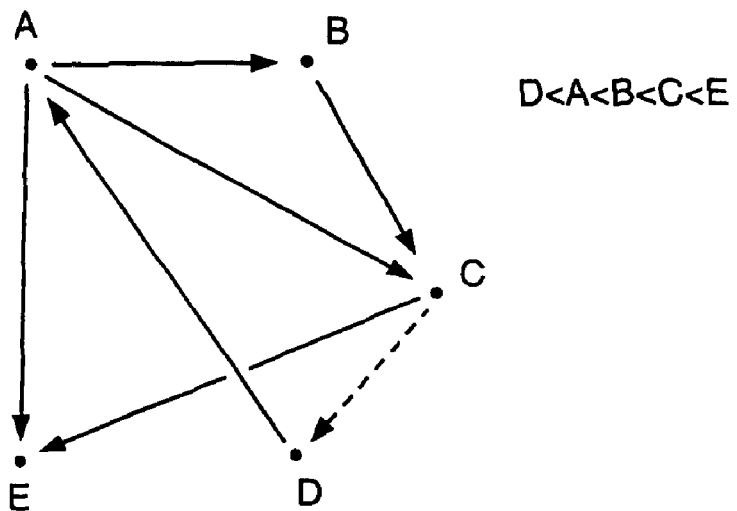
FIGS. 19A-B are graphs which illustrate an alternative identification of scheduling sub-groups.
Figure 19B:
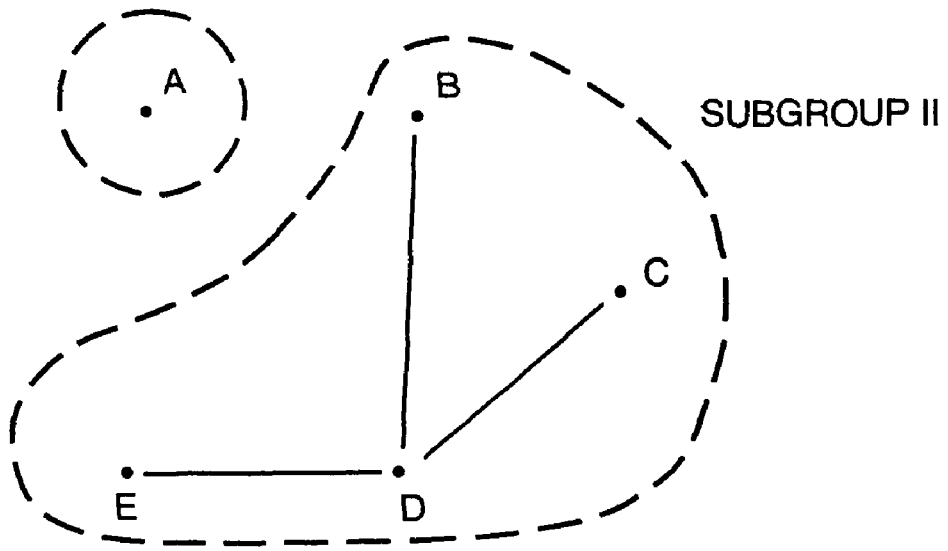

Referring to FIGS. 19A-B, TRAC 130 finds different subgroups if it forms the second directed graph by removing a different arc. In FIG. 19A, the second directed graph is formed by removing the C-D arc. In FIG. 19C, the resulting third undirected graph yields sub-groups {A} and {B,C,D,E}. As introduced above, the choice of which arcs to remove can in some embodiments be made to optimize criteria, such as separating different rules that are desirable to trigger together into different sub-groups.

Figure 20:
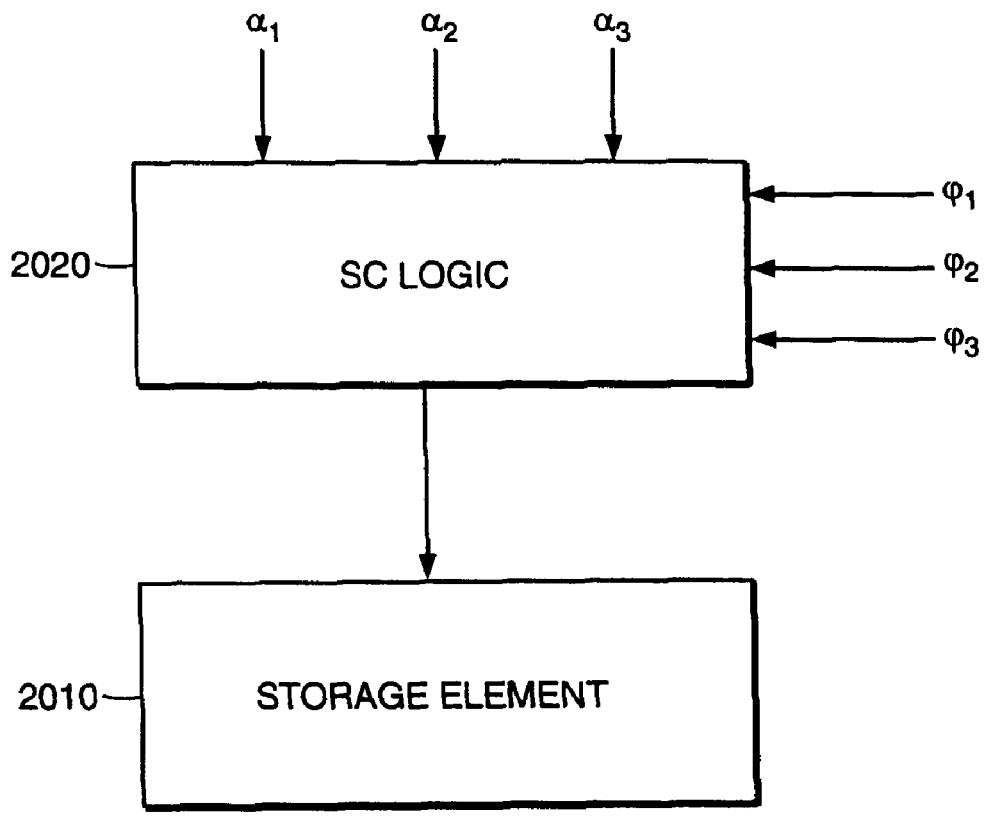
FIG. 20 is a block diagram of update combination logic for a sequential combination of rules.

TRAC 130 generates update combination logic for each storage element based on the data type of the storage element, and the nature of the potential conflict. Referring to FIG. 20, a general structure for the update combination logic associated with a storage element 2010 is a sequential combination (SC) logic 2020 accepts signals that correspond to a number of actions, illustrated as $\alpha_1$, $\alpha_2$, and $\alpha_1$, and outputs to the storage element a signal corresponding to the sequential combination of those actions based on the trigger signals $\phi_1$, $\phi_2$, and $\phi_3$, that are generated by the scheduling logic and are applied to SC logic 2020. Recall that in forming the second directed graph, TRAC 130 has established an ordering for the rules in a scheduling group such that if the scheduling logic asserts a set of trigger signals for rules in the group, then each triggered rule is sequentially composable with each triggered rule later in the sequence. Without loss of generality, in FIG. 20, rule 1, rule 2, and rule 3 are ordered according to this ordering of rules.

Figure 21:
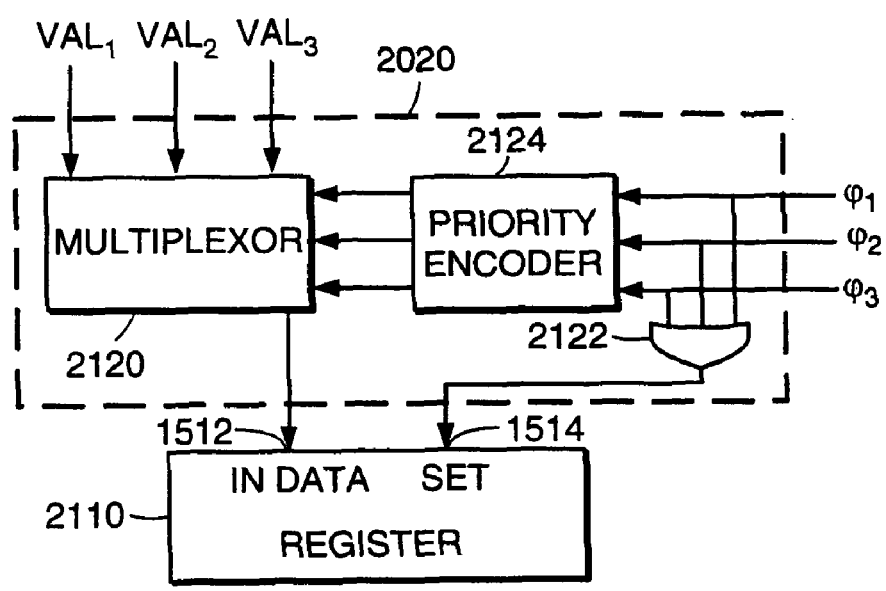
FIG. 21 is a circuit diagram for update combination logic for a sequential combination of set actions for a register storage element.

Referring to FIG. 21, if, for example, rules 1, 2, and 3 have a range conflict with a register storage element 2110, that is, each rule has an action that sets the value of the register, then two or more of the trigger signals $\phi_1$, $\phi_2$, and $\phi_3$, may be asserted in a clocking period. Sequential composition of these set(val) actions associated with these rules dictates that the latest of these triggered rules determines which value will be set in the register. One implementation of SC logic 2020 uses a multiplexer 2120 and a priority encoder 2124. Priority encoder 2124 determines while is the last of the asserted trigger signals, and asserts that select input for multiplexer 2120. The multiplexer then passes the corresponding value to the input data port of the register. OR logic 2122 asserts the set line for the register if any of the rules is triggered.

In a variant of this approach, TRAC 130 generates scheduling logic using combinatorial logic for each subset rather than priority encoders. For a particular subset, the combinatorial logic has the characteristic that for at least some combinations of input enable signals, it asserts two or more trigger signals. The asserted trigger signals have the property that taken in the static ordering determined by the second acyclic graph, each triggered rule is sequentially composable with each of the other triggered rules in that subgroup that are later in the sequence. Each triggered rule is also sequentially composable with the triggered rules in the other sub-groups that are later in the ordering.

Referring to FIG. 22, a table characterizes one implementation of the combination logic for the first sub-group of rules, {A,B,D,E}, of the example shown in FIGS. 18A-C. For example, if both rules D and E are enabled (line 2204 in the table), they cannot both be triggered since they are not known to be sequentially composable (there is no arc joining those node in the second directed graph in FIG. 18B). In this implementation, rule D is triggered. On the other hand, if both rules B and D are enabled (line 2206), they are both trigged since rule B is sequentially composable with rule B. If rules A, B, and E are enabled (line 2213), then they can be all triggered, since A is sequentially composable with both B and E, and B is sequentially composable with E.

As with the use of enumerated conflict-free sets, alternative variants do not necessarily trigger maximal subsets of rules within a scheduling sub-group. For example, combinatorial logic that encodes an entire input-output table may consume too many resources (too many gates) and a sub-optimal encoder can be used. In one alternative variant, this logic is generated to trigger rules within a subgroup that are often enable together when the circuit used.

5 Modular and Software Implementations

In the description above, the synthesis of a synchronous digital circuit is described largely in the context of synthesis of a single circuit, such as and integrated circuit. The approach is equally applicable to synthesis of a modular system, for instance, composed of multiple integrated circuits. For example, the storage elements of the system can be optionally partitioned into separate modules, and each module implemented as a separate circuit with interfaces between the modules coupling the separate circuits.

In some systems, it may be desirable to implement some of the interacting modules using a software implementation. For example, the asynchronous system specification may define operation of interacting modules where one module is to be implemented as an integrated circuit while another module that interacts with the first is implemented in software, for instance, on a general-purpose processor. The TRS specification for the software module is compiled into software using one of a number of techniques. For instance, the software can be implemented using a standard event-driven programming approach in which the software implements a loop in which an enabled rules is first selected and then selected the rule is applied.

Within a circuit, a software implementation of a portion of a circuit can also be used. For example, a submodule of an integrated circuit may be implemented using a micro-coded approach in which the submodule includes a processor and the software is stored in memory circuitry in the submodule. In this approach, a number of storage elements are identified as forming the submodule. Then, all rules that use only the storage elements of the submodule are implemented in microcode. The external interfaces for the storage elements of the submodule are also implemented in micro-code. In synthesizing the overall circuit, the TRAC compiler combines the circuitry for the software-implemented submodule with the circuitry synthesized using the approaches described above.

6 Third Example

In the following description, the approach described in Section 4.3, which makes use of the conflict-free property, is used in another example. This example involves the task of specifying a simple processor, then specifying a pipelined version of the processor and finally specifying a superscalar version of the processor. An aspect of this last transformation, from pipelined to superscalar, makes use of a rule composition property of TRS specifications. The rule-composition property allows new rules to be derived by composing existing rules without introducing illegal behaviors to the system.

An architect starts by formulating a high-level specification of the processor's instruction set architecture (ISA) as a TRS. The goal at this stage is to define an ISA as precisely as possible without injecting implementation details. From such a description, the architect, using TRAC 130, generates a RTL (Register Transfer Language) description of a single-issue, in-order, non-pipelined processor. The generated RTL can be simulated and synthesized by commercial tools.

Next, the architect manually transforms the ISA's TRS description into another TRS that corresponds to a pipelined microarchitecture. In this step, the architect makes high-level architectural decisions such as the locations of the pipeline stages. FIFO queues are introduced between pipeline stages, thereby making many of the rules local to particular pipeline stages and not conflicting with rules local to other pipeline stages. A rule typically dequeues a partially executed instruction from one FIFO queue, computes on it using only local information, and enqueues it into the next FIFO. The architect is also responsible for exposing and resolving any data and control hazards introduced by pipelining. To guard against possible errors introduced during this manual transformation, a semiautomatic verification technique is optionally used to show the correctness of the pipelined TRS against the original ISA specification using state-simulation techniques. Using TRAC 130, the architect takes the asynchronous specifications and generate RTL's for synchronous pipelines.

Finally, the architect transforms the pipelined TRS into a superscalar TRS by devising composite rules. The effect of a composite rule is to apply more than one pipeline rule at each stage of the pipeline. As is described further below, this rule composition can optionally be done automatically once the degree of "superscalarity" is specified. The correctness of the resulting transformation is guaranteed because the rules derived by rule composition are always correct by TRS semantics.

Both pipelining and superscalar transformations are source-to-source in the TRS language and the resulting TRS descriptions can be compiled into Verilog RTL descriptions using TRAC 130. Throughout the design flow, the architect can compile intermediate designs. The architect can evaluate the RTL's of these compiled intermediate designs to steer design decisions in successive refinement steps. For instance, a tool, such as the commercially available Synopsys RTL Analyzer, is used to analyze the size and speed of the circuit designed from the RTL description. In addition, the operation of the processor on sample programs can be examined using a commercial Verilog RTL simulator. Based on the prompt feedback from these tools, the architect can rapidly explore a large number of architectural options and trade-offs.

Returning now to the architect's first step in the example, he first specifies a single-issue, in-order, non-pipelined processor that implement a desired instruction set architecture. In this example, programmer visible state of the processor consists of a program counter, a register file, instruction ROM (read-only memory) and data RAM (read-write memory). Referring to FIG. 7, the programmer-visible state is represented using the terms generated of the types listed in lines 701 through 715. Type PROC (line 701) is a product type with the constructor symbol Proc( ) and four fields. The declaration of type INST (line 709) demonstrates the use of an algebraic union to represent the processor instruction set. For simplicity, the program and data memory are modeled as storage arrays internal to the processor. Optionally, the memory arrays are replaced by external memory interfaces represented as FIFO's prior to synthesis of a final circuit.

Referring to FIG. 8, a set of rewrite rules define processor's dynamic behavior. For brevity, the LHS is listed only once (line 801) and is the same for all the rules. Also, the rule at line 804 is a shorthand for the rules for all arithmetic operations, op, that take two register values and puts the result of applying the appropriate function op(,) to the two register arguments. For example, the following rule describes the effect of executing an Add instruction.

```
Proc(pc,rf,im,dm)
if im[pc]=Op(Add,rd,r1,r2)
→ Proc(pc+1,rf[rd:=rf[r1]+rf[r2]],im,dm)
```

The predicate is true if the program counter points to an instruction memory location containing Op(Add,rd,r1,r2). When a term satisfies both the LHS template and the predicate, the rule's RHS rewrite template specifies that the pc field should be incremented by 1 and register rd should be updated by rf[r1]+rf[r2].

Figure 9:
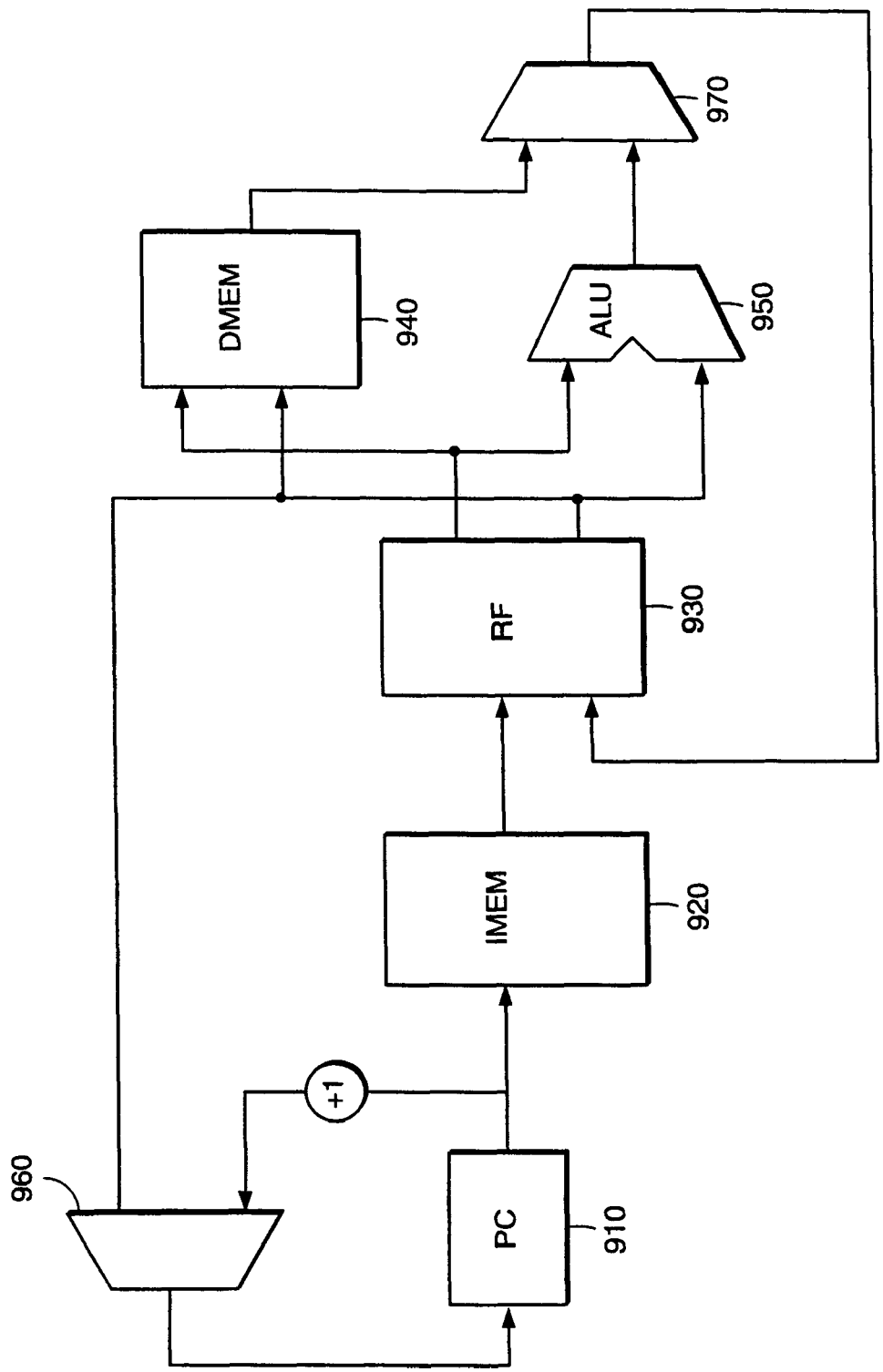
FIG. 9 is a logical structure of a processor defined by the system specification.

Referring to FIG. 9, when synthesized, this TRS corresponds, at least logically from the point of view of a programmer, to the datapaths shown. PC 910 is a register that stores the program counter which is used to retrieve instructions from instruction memory, IMEM 920. Instructions from IMEM 920 are used to address particular registers in register file RF 930. The values from RF 930 are fed to an ALU 950, to data memory, DMEM 940, or to a selector 960 that determines the next value of PC. A selector 970 selects a value from ALU 950 or DMEM 940 to store in a register in RF 930.

In the next step, the architect rewrites the TRS specification shown in FIG. 11 by essentially splitting rules into subrules that provide the same overall functionality from the point of view of a programmer, with the intention that multiple subrules may execute in parallel and that the implemented processor may execute instructions at a higher overall rate.

Figure 10:
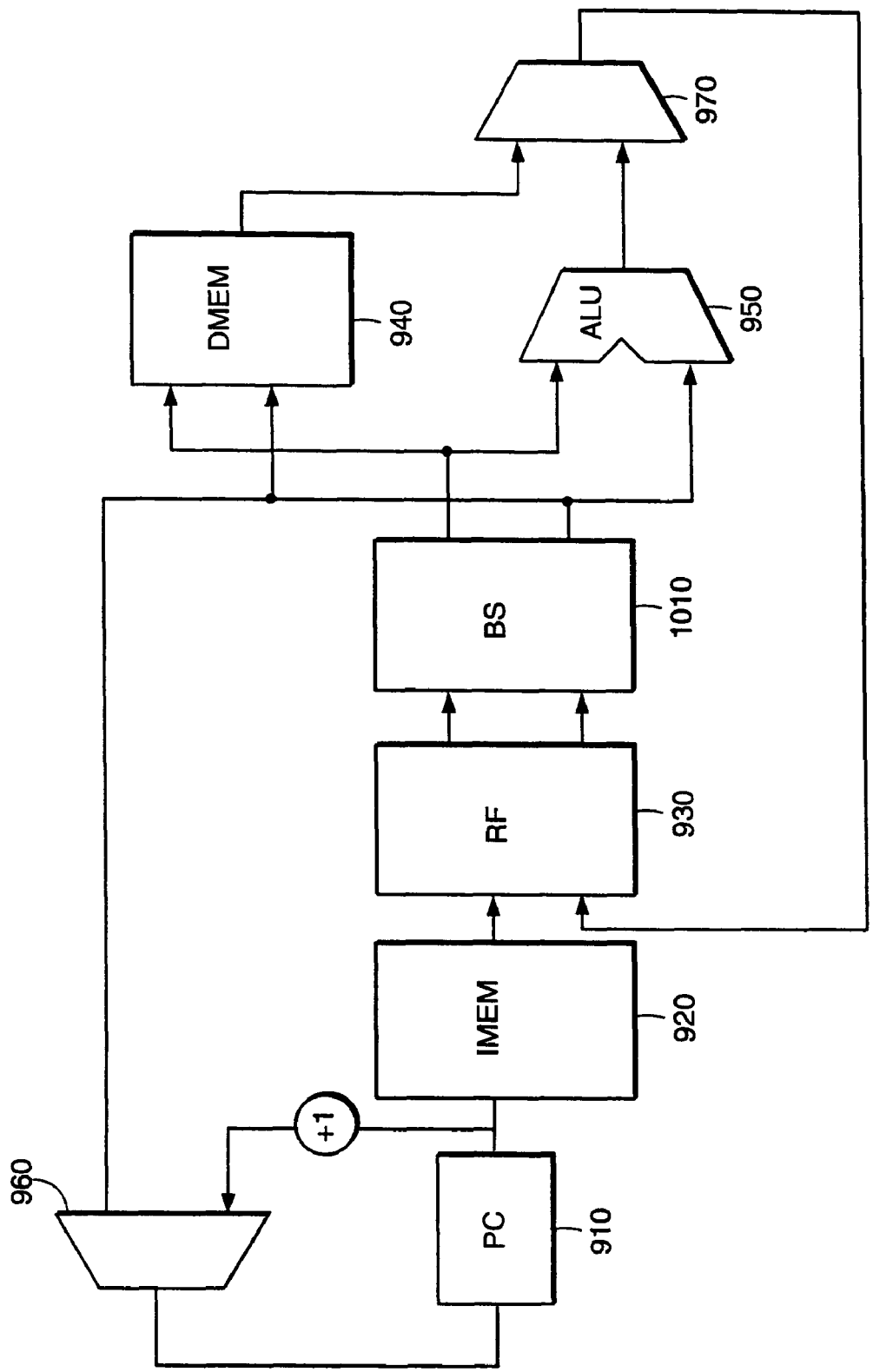
FIG. 10 is a logical structure of a processor which includes a pipeline buffer.

Referring to FIG. 10, the datapaths shown in FIG. 9 are modified to include a FIFO queue BS 1010 between register file RF 930 and ALU 950. The FIFO queue is used to buffer partially decoded instructions in which the operand values have been fetched from RF 930 but the operation has not yet been performed.

Referring to FIG. 11, the architect modifies the system specification shown in FIGS. 7-8 for pipelined operation corresponding to the datapaths shown in FIG. 10. In FIG. 11, type $PROC_p$, defined in line 1101, contains a new field, the FIFO queue BS 1010, to hold instructions after they have been decoded and the operands have been fetched.

Referring to FIG. 12A, all of the processor rules can be partitioned into separate fetch and execute rules to represent a two-stage pipeline. Lines 1201-1203 are a generic fetch rule. Splitting a rule into smaller rules destroys the atomicity of the original rule and thus, can cause new behaviors which may not conform to the original specifications. Therefore, in addition to determining the appropriate division of work across the stages, the architect must also resolve any newly created hazards. The predicate at line 1202 has two terms, one that identifies the particular instruction, inst, and a second term that guarantees that the source operands of the instruction, denoted in shorthand as Source(inst), are not also the target of any instruction already enqueued in bs, denoted in shorthand as Target(bs). This second term inhibits fetching when a read-after-write (RAW) hazard exists. If the architect were to make a mistake in the transformation, the error would be revealed when an attempt is made to verify the equivalence of the pipelined processor against the initial specification via TRS simulation. The RHS, at line 1203, includes the shorthand Decode(inst), which refers to the instruction decoded with its operand values already fetched. Referring to FIG. 12B the execute rules for the ISA make use of the prefetched instructions enqueued in BS 1010. The LHS is shown once in line 1211 for the predicates and RHSs shown in lines 1212-1216. For example, considering the pair of Bz rules shown in FIG. 8, lines 805-806 which describe the effect of branch taken versus not taken conditions in the version without a FIFO buffer, the architect splits these rules into their fetch (instances of the generic fetch rule at lines 1201-1203) and execute components. Both rules share the same fetch rule. In the fetch phase, the processor performs a weak form of branch speculation by incrementing pc without knowing the branch resolution. Consequently, in the execute phase, if the branch is resolved as taken (execute rule at line 1213), besides restarting pc at the correct value, speculatively fetched instructions in BS 1010 are discarded by setting bs to <empty> in the Bz-taken rule at line 1213.

In the third step, the architect rewrites the rules in such a way that multiple instructions can be processed in a pipeline stage in one clock cycle. To achieve two-way superscalar execution, the architect composes two rules that specify operations in the same pipeline stage into a new composite rule that combines the state transitions of both rules. Since the TRAC compiler generates RTL that executes the transitions of a rule in a single clock cycle, the compilation of composite rules results in RTL that can execute two instructions at a time.

In order to illustrate this approach, consider the fetch rules shown generically in FIG. 12A at lines 1201-1203. Bz-fetch and Op-fetch rules that are instances of this generic rule can be written as:

```
Bz-fetch rule:
Proc_p(pc,rf,bs,im,dm)
if im[pc] is Bz(rc,rt) AND rc not in Target(bs)
                        AND ra not in Target(bs)
→ Proc_p(pc+1,rf,bs'),im,dm)
    where bs'=enq(bs,Bz(rf[rc],rf[rt])
Op-fetch rule:
Proc_p(pc,rf,bs,im,dm)
if im[pc] is Op(op,rd,r1,r2) AND
            r1 not in Target(bs) AND
            r2 not in Target(bs)
```

```
      → Proc_p(pc+1,rf,bs',im,dm)
          where bs'=enq(bs,Op(op,rd,rf[r1],rf[r2]))
```

The Bz-fetch rule rewritten as if it was being applied to the term on the RHS of the Op-fetch rule takes the form of the following rule:

```
Bz-fetch-1 rule:
Proc_p(pc+1,rf,bs',im,dm)
if im[pc+1] is Bz(rc,rt)
AND bs'=enq(bs,Op(op,rd,rf[r1],rf[r2])
AND rc not in Target(bs')
AND ra not in Target(bs')
→ Proc_p((pc+1)+1,rf,bs'',im,dm)
    where bs''=enq(bs',Bz(rf[rc],rf[rt]),
```

Bz-fetch-1 rule is more specific than the general Bz-fetch rule because it requires BS to contain a partially executed Op instruction. Now we can combine the effect of the Op-fetch and Bz-fetch-1 rules into a single atomic rule as follows:

```
Op/Bz-fetch rule:
Proc_p(pc,rf,bs,im,dm)
if im[pc] is Op(op,rd,r1,r2)
AND  r1 not in Target(bs)
AND  r2 not in Target(bs)
AND im[pc+1] is Bz(rc,rt)
AND rc not in Target(bs')
AND ra not in Target(bs')
    where bs'=enq(bs,Op(op,rd,rf[r1],rf[r2]))
→ Proc_p((pc+1)+1,rf,bs'',im,dm)
    where bs''=enq(bs',Bz(rf[rc],rf[rt]))
```

The above Op/Bz-fetch rule is an example of a derived rule, that is, it is a rule that is be derived from other TRS rules. A derived rule is guaranteed to be correct, that is, it cannot introduce observable behaviors which were not permitted by the original rules. However, if the derived rule replaces the rules from which it was derived, the system may not show some behaviors which were permitted otherwise. Although this error does not lead to illegal state transitions, it could result in a deadlock. Hence, unless other provisions are made, each new composite rule is simply added to the original set of rules and does not, in general, replace any of the original rules.

The TRAC compiler, in general, synthesizes very different circuits for composite and non-composite rules. Since the effect of a composite rule takes place in one cycle, significantly more resources and circuitry are required to implement composite rules. Using its understanding of the abstract data type operations, the compiler also tries to simplify the predicate. For example, the predicate in the above Op/Bz-fetch rule can be simplified as follows:

```
Op/Bz-fetch rule:
Proc_p(pc,rf,bs,im,dm)
if im[pc] is Op(op,rd,r1,r2)
AND im[pc+1] is Bz(rc,rt)
AND  r1 not in Target(bs)
AND  r2 not in Target(bs)
AND  rc not in Target(bs)
AND  rt not in Target(bs)
AND rc not equal rd
```
```
AND rt not equal rd
→ Proc_p((pc+1)+1,rf,bs',im,dm)
    where bs'=enq(enq(bs,Op(op,rd,rf[r1],rf[r2])),
                  Bz(rf[rc],rf[rt]))
```

Complete superscalar fetching of all possible instruction pairs would require the composition of all combinations of the original fetch rules from the 2-stage pipelined microarchitecture. In general, given a pipeline stage with N rules, a superscalar transformation leads to an $O(N^s)$ increase in the number of rules where s is the degree of superscalarity. Fortunately, the mechanical nature of this tedious transformation is handled by a computer aided synthesis system. Superscalar transformation also implies duplication of hardware resources such as register file ports, ALU's and memory ports. Hence, one may not want to compose all combinations of rules in a stage. For example, we may not want to compose any other execute rules with memory load or store rules if the memory interface can only accept one operation per cycle.

Abstractly, the procedure for forming a composition of rules $r_1$ and $r_2$, where the rules are written as

```
Rule r_1:
s_1
if p_1
→ s_1'
Rule r_2:
s_2
if p_2
→ s_2'
``` is formed by first rewriting rule $r_2$ to be directly applicable to the RHS of rule $r_1$ as follows:

```
Rule r_2:
s_1'
if p_2'
→ s_2''
```

This yields the composite rule

```
Rule r_1/r_2:
s_1
if p_1 AND p_2'
→ s_2''
```

To transform the 2-stage pipelined microarchitecture into a two-way superscalar microarchitecture involves derivation of a composite rule for each pair in the cross product of rules for each pipeline stage.

Referring to FIG. 13A, a generic version of a superscalar fetch rule is shown, corresponding to a composition of two instances of the generic fetch rule shown in FIG. 12A.

Referring to FIG. 13B, composition of Op rules, line 1212 in FIG. 12B, and any of the other execution rules shown in FIG. 12B can always be executed as shown in lines 1311-1316. Note that most rules shown in FIG. 13B require additional read ports in the register file, RF 930. Some combinations also require two write-ports.

There is no valid composition because the RHS of Bz-taken rule (line 1213 in FIG. 12B) produces an empty FIFO queue. Every execute-stage rule in FIG. 12B requires the FIFO queue BS to satisfy the condition notEmpty(bs) and the variable inst is bound to first(bs).

Referring to FIG. 13C executing a Bz-not-taken rule (line 1214 in FIG. 12B) has no side-effects other than removing its template from the head of bs. Hence, composing a Bz-not-taken rule with any other rule produces a composite rule that is nearly identical to the second rule in the composition. This is true even if the second rule being composed is Bz-taken or Bz-not-taken. The composite rules shown in FIG. 13C correspond directly to the basic rules in FIG. 12B.

Referring to FIG. 13D, since we have assumed a single ported memory, DMEM 940, it is not possible to compose a memory access rule (Load or Store) with another memory access rule. The composition of a Load rule with the non-memory access basic rules shown in lines 1212-1214 in FIG. 12B are shown in FIG. 13D. The composition of a Store rule with these basic rules is shown in FIG. 13E.

Note that these composite rules, shown in FIGS. 13A-E do not replace the original rules shown in FIGS. 12A-B. For instance, all five rules shown in FIG. 12B are needed in case there is only one instruction in BS.

In an alternative embodiment, the approach described above is used in conjunction with predefined modules for which synchronous hardware specifications are already available. An interface is defined for each of these modules, and the asynchronous system is specified in terms of these interfaces. This allows the architect to focus on the task of interconnecting and coordinating the modules separately from defining the internal aspects of the modules themselves. Examples of such predefined modules include memory units, such as multi-ported register files of cache memory units, and functional units, such as arithmetic units. Similarly, in yet another alternative embodiment the approach described above is used to design a synchronous circuit that forms a module that will later be incorporated into an overall system using any of a number of design approaches for synchronous circuits.

It is to be understood that while the invention has been described in conjunction with the detailed description thereof, the foregoing description is intended only to illustrate particular embodiments of the invention and not to limit the scope of the invention, which is defined by the scope of the appended claims. Other aspects, advantages, and modifications are within the scope of the following claims.

What is claimed is:

1. A method for forming a specification for a synchronous digital system according to a specification of an asynchronous nondeterministic digital system, the method comprising:
    accepting the specification of the asynchronous system, including accepting
        (a) a specification of a plurality of data elements, and
        (b) a specification of a plurality of rules for updating values of the data elements of the asynchronous system, each rule including a condition required to be satisfied by the values of the data elements, and an operation for calculating updated values of one or more of the data elements if the condition is satisfied, wherein any sequence of values of data elements of the asynchronous system corresponds to a sequence of atomic applications of the rules; and
    forming, using a computer, the specification for the synchronous digital system, including forming specifications of
        (a) a plurality of circuit components including storage elements each implementing a corresponding one of the data elements,
        (b) circuitry for determining if required conditions of the rules are satisfied and for selecting rules according to which to update the storage elements with updated values in each cycle during operation of the synchronous system, and circuitry for implementing the operations for calculating the updated values, and
        (c) circuitry for passing values stored in the circuit components implementing the data elements to the circuitry for determining if the conditions are satisfied, and circuitry for passing values from circuitry implementing the operations to the circuit components implementing the data elements;
    wherein any sequential updated values of the storage elements of the synchronous system correspond to some sequential atomic application of rules of the asynchronous system.

2. The method of claim 1 wherein selecting a set of operations of the rules according to which to update the storage elements for at least some clock cycles includes selecting a set of multiple operations, and wherein the circuitry for implementing the multiple operations is configured to implement the selected operations concurrently.

3. The method of claim 1 wherein the circuitry for implementing the operations for calculating the updated values comprises circuitry for implementing each of said operations in a single cycle of the synchronous system.

4. The method of claim 1 wherein at least some of the operations for calculating the updated values include arithmetic operations.

5. The method of claim 1 wherein forming the specification for the synchronous digital system includes specifying one or more interacting modules, each module implementing one or more of the operations for updating values of the data elements.

6. The method of claim 5 wherein specifying the one or more interacting modules includes specifying at least one software implemented module.

7. The method of claim 6 wherein specifying the software implemented module includes specifying instructions for updating storage corresponding to at least some of the data elements according to actions of the rules.

8. The method of claim 6 wherein specifying the software implemented module includes specifying instructions for a general purpose processor.

9. The method of claim 6 wherein specifying the software implemented module includes specifying instructions for a micro-coded module.

10. The method of claim 6 wherein forming the specification for the synchronous digital system includes forming a specification for circuitry coupling a software implemented module circuitry with the circuitry for determining if required conditions of rules are satisfied and selecting a set of operations of the rules according to which to update the storage elements and the circuitry for implementing the operations for calculating the updated values.

11. The method of claim 5 wherein specifying the one or more interacting modules includes forming data for configuring a programmable gate array.

12. The method of claim 1 wherein accepting the specification of the asynchronous system includes accepting a specification of a predefined module, the specification of the predefined module including a specification of a module interface, and wherein the specification of the rules includes operations specified according to the module interface.

13. The method of claim 12 wherein the predefined module includes a module form a group consisting of a memory unit, a FIFO, a multiported register file, and an arithmetic unit.

14. The method of claim 12 wherein forming the specification of the synchronous system includes incorporating a specification of a synchronous circuit implementation of the predefined module.

15. The method of claim 14 wherein the specification of the synchronous circuit implementation is formed according to an asynchronous circuit specification of the predefined module.

16. The method of claim 1 wherein the specification of the asynchronous digital system includes a software specification of the asynchronous digital system.

17. The method of claim 16 wherein the software specification of the asynchronous digital system includes a hardware description language representation of the asynchronous digital system.

18. The method of claim 17 wherein the hardware description language representation of the asynchronous digital system includes a Verilog model of the asynchronous digital system.

* * * * *